(12) United States Patent
Robbins et al.

(10) Patent No.: US 8,409,351 B2
(45) Date of Patent: Apr. 2, 2013

(54) PRODUCTION OF BULK SILICON CARBIDE WITH HOT-FILAMENT CHEMICAL VAPOR DEPOSITION

(75) Inventors: Joshua Robbins, Golden, CO (US); Michael Seman, Golden, CO (US)

(73) Assignee: SiC Systems, Inc., Golden, CO (US)

( * ) Notice: Subject to any disclaimer, the term of this patent is extended or adjusted under 35 U.S.C. 154(b) by 964 days.

(21) Appl. No.: 12/186,112

(22) Filed: Aug. 5, 2008

(65) Prior Publication Data

US 2009/0038541 A1  Feb. 12, 2009

Related U.S. Application Data

(60) Provisional application No. 60/954,789, filed on Aug. 8, 2007.

(51) Int. Cl.
*C30B 23/06* (2006.01)

(52) U.S. Cl. ............ 117/103; 117/84; 117/88; 117/104; 117/108; 427/585; 427/587; 427/588; 427/589; 427/595; 427/596; 427/248.1; 427/249.1

(58) Field of Classification Search ............ 117/84, 117/88, 103–104, 208, 937, 952; 427/248.1, 427/249.1, 585, 587–589, 595–596
See application file for complete search history.

(56) References Cited

U.S. PATENT DOCUMENTS

| | | | |
|---|---|---|---|
| 2,854,364 A | | 9/1958 | Lely et al. |
| 2,854,365 A | | 9/1958 | Lely et al. |
| 4,707,384 A | | 11/1987 | Schachner et al. |
| 4,866,005 A | | 9/1989 | Davis et al. |
| 5,186,973 A | * | 2/1993 | Garg et al. ............ 427/590 |
| 5,443,032 A | * | 8/1995 | Vichr et al. ............ 117/84 |
| 5,704,985 A | | 1/1998 | Kordina et al. |
| 6,056,820 A | | 5/2000 | Balakrishna et al. |
| 6,534,026 B2 | | 3/2003 | Vodakov et al. |
| 6,562,130 B2 | | 5/2003 | Vodakov et al. |
| 6,780,243 B1 | | 8/2004 | Wang et al. |
| 6,994,756 B2 | | 2/2006 | Yamada et al. |
| 7,147,713 B2 | * | 12/2006 | Kordina ............ 117/84 |
| 2001/0031541 A1 | * | 10/2001 | Madan et al. ............ 438/482 |
| 2004/0161875 A1 | * | 8/2004 | Chu et al. ............ 438/105 |
| 2006/0075958 A1 | | 4/2006 | Powell et al. |
| 2006/0137600 A1 | * | 6/2006 | Ellison et al. ............ 117/19 |
| 2006/0254513 A1 | * | 11/2006 | Kang et al. ............ 118/715 |

OTHER PUBLICATIONS

Z. Zhiyong, et al. in "Epitaxial monocrystalline SiC films grown on Si by HFCVD at 780 C," Mat. Sci. and Eng. B, vol. 75, pp. 177-179 (2000).*

E. Kondoh, et al. in "Determination of activation energies for diamond growth by an advanced hot filament chemical vapor deposition method," Appl. Phys. Lett. 59, 488 (1991).*

(Continued)

*Primary Examiner* — Michael Kornakov
*Assistant Examiner* — Kenneth A Bratland, Jr.

(57) ABSTRACT

A method to grow a boule of silicon carbide is described. The method may include flowing a silicon-containing precursor and a carbon-containing precursor proximate to a heated filament array and forming the silicon carbide boule on a substrate from reactions of the heated silicon-containing and carbon-containing precursors. Also, an apparatus for growing a silicon carbide boule is described. The apparatus may include a deposition chamber to deposit silicon carbide on a substrate, and a precursor transport system for introducing silicon-containing and carbon-containing precursors into the deposition chamber. The apparatus may also include at least one filament or filament segment capable of being heated to a temperature that can activate the precursors, and a substrate pedestal to hold a deposition substrate upon which the silicon carbide boule is grown. The pedestal may be operable to change the distance between the substrate and the filament as the silicon carbide boule is grown.

38 Claims, 17 Drawing Sheets

OTHER PUBLICATIONS

Y. Foo, et al. in "C incorporation and segregation during Si1-yCy/Si(001) gas-source molecular beam epitaxy from Si2H6 and CH3SiH3," Surf. Sci. 513, 475 (2002).*

PCT International Search Report mailed Nov. 5, 2008, International Application No. PCT/US08/72661, 12 pages.

Allendorf, M. D., et al., "A Model of Silicon Carbide Chemical Vapor Deposition", *J. Electrochem. Soc.*, vol. 138, pp. 841-852, 1991.

Anikin, M., et al., "Influence of growth conditions on the defect formation in SiC ingots", *Mat. Sci. and Eng. B*, vol. B61-62, pp. 73-76, 1999.

Bootsma, G. A., et al., "Phase transformations, habit changes and crystal growth in SiC", *J. Cryst. Growth* 8 341 (1971).

Chassagne, T., et al., "Control of 3C-SiC/Si wafer bending by the checkerboard carbonization method", Phys. Stat. Sol. (a) 202 524 (2005).

Delplanke, M. P., et al., "Preparation and characterization of amorphous SiC:H thin films", J. Vac. Sci. Technol. A, vol. 9, pp. 450-455, 1991.

Doyle, J., et al., "Production of high-quality amorphous silicon films by evaporative silane surface decomposition", *J. Appl. Phys.*, vol. 64, pp. 3215-3223, 1988.

Ellison, A. et al., "High temperature CVD growth of SiC", *Mat. Sci. and Eng. B*, vol. 61-62, pp. 113-120, 1999.

Frenklach, M., et al., "Detailed surface and gas-phase chemical kinetics of diamond deposition", *Phys. Rev. B*, vol. 43, pp. 1520-1545, 1991.

Fung, C. D., et al., "Thermal oxidation of 3C silicon carbide singlecrystal layers on silicon", *Appl. Phys. Lett.* 45 757 (1984).

Gallagher, A., "Some physics and chemistry of hot-wire deposition", *Thin Solid Films*, vol. 395, pp. 25-28, 2001.

Golecki, I., et al., "Single-crystalline, epitaxial cubic SiC films grown on (100) Si at 750° C by chemical vapor deposition", *Appl. Phys. Lett.*, vol. 60, pp. 1703-1705, 1992.

Goodwin, D. G., et al., "Numerical modeling of the filament-assisted diamond growth environment", *J. Appl. Phys.*, vol. 68, pp. 6393-6400, 1990.

Gupta, A., et al., "Selective epitaxy and lateral overgrowth of 3C-SiC on Si—A review", *Prog. in Cryst. Growth and Char. of Mater.* 51 43 (2005).

Hofmann, D. H., et al., "Prospects of the use of liquid phase techniques for the growth of bulk silicon carbide crystals", *Mat. Sci. and Eng. B*, vol. 61-62, pp. 29-39, 1999.

Irokawa, Y., et al., "Growth of 3C-SiC layers on Si substrates with a novel stress relaxation structure", *Jpn. J. Appl. Phys.* 40 5907 (2001).

Ishibashi, K., "Development of the Cat-CVD apparatus and its feasibility for mass production", *Thin Solid Films* 395 55 (2001).

Itoh, T., et al., "Effect of hydrogen radical on growth of uC-Si in hetero-structured SiCx alloy films", *Thin Solid Films*, vol. 430, pp. 33-36, 2003.

Itoh, T., et al., "Influence of different carbon source gases on preparation and properties of a-Si1-xCx:H alloy films including uc-Si:H by hot-wire CVD", *J. of Non-Cryst. Solids*, vol. 299-302, pp. 880-884, 2002.

Johnson, A. D. et al., "Kinetics of silicon carbide CVD: surface decomposition of silacyclobutane and methylsilane", *J. Phys. Chem.*, vol. 97, pp. 12937-12948, 1993.

Kimoto, T., et al., "Growth mechanism of 6H-SiC in step controlled epitaxy", *J. Appl. Phys.* 15 726 (1993).

Kondoh, E., et al., "Determination of activation energies for diamond growth by an advanced hot filament chemical vapor deposition method", *Appl. Phys. Lett.*, vol. 59, pp. 488-490, 1991.

Krishna P., et al., "The discovery of a 2H-3C solid state transformation in silicon carbide single crystals", *J. Cryst. Growth* 8 129 (1971).

Krishna P., et al., "The structure, perfection and annealing behavior of SiC needles by a VLS mechanism", *J. Cryst. Growth* 9 319 (1971).

Krishna, P., et al., "Direct transformation from the 2H to the 6H structure in single crystal silicon carbide", *J. Cryst. Growth* 11 147 (1971).

Ledermann, A., et al., "Influence of gas supply and filament geometry on the large-area deposition of amorphous silicon by hot-wire CVD", *Thin Solid Films*, vol. 395, pp. 61-65, 2001.

Lee, M. S., et al., "Temperature effects in the hot wire chemical vapor deposition of amorphous hydrogenated silicon carbon alloy", *J. Appl. Phys.*, vol. 87, pp. 4600-4610, 2000.

Loboda, M. J., et al., "Growth of crystalline silicon carbide by CVD using chlorosilane gases", *Mat. Res. Soc. Symp. Proc.* 911 49 (2006) (abstract).

Lu, P., et al., "High-speed homo epitaxy of SiC from methyltrichlorosilane by chemical vapor deposition", *J. Cryst. Growth* 285 506 (2005).

Mahan, A. H., "Status of Cat-CVD (Hot Wire CVD) research in the United States", *Thin Solid Films*, vol. 395, pp. 12-16, 2001.

Nagasawa, H., et al., "3C-SiC hetero-eptaxial growth on undulant Si (001) substrates", *J. Cryst. Growth* 273-279 1244 (2002).

Nagasawa, H., et al., "Hetero- and homoepitaxial growth of 3C-SiC for MOS-FETs", *Micro. Electron. Eng.* 83 185 (2006).

Neudeck, P. G., et al., "CVD growth of 3C-SiC on 4H/6H Mesas", *Chemical Vapor Deposition* 12 531 (2006).

Nishino, S., et al., "Channel Epitaxy of 3C-SiC on Si substrates by CVD", *Mat. Res. Soc. Symp. Proc.* 742 15 (2003) (abstract).

Nishino, S., et al., "Production of large area single crystal wafers of cubic SiC for semiconductor devices", *Appl. Phys. Lett.* 42 460 (1983).

Otsuka, T., et al., "Hydrogen dissociation on hot tantalum and tungsten filaments under diamond deposition conditions", *J. Appl. Phys.*, vol. 77, pp. 893-898, 1995.

Papasouliotis, G. D., et al., "Experimental study of atmospheric pressure chemical vapor deposition of silicon carbide from methyltrichlorosilane", *J. Mat. Res.*, vol. 14, pp. 3397-3409, 1999.

Parsons, J. D., et al., "Morphological Structure of Silicon Carbide, Chemically Vapor Deposited on Titanium Carbide, Using Ethylene, Carbon Tetrachloride, and Silicon Tetrachloride", *J. Electrochem. Soc.*, vol. 141, pp. 771-777, 1994.

Powell, J. A., et al., "Controlled growth of 3C-SiC on lowtilt-angle vicinal (0001) 6H-SiC wafers", *Appl. Phys. Lett.* 59 (1991).

Powell, J. A., et al., "Epitaxial growth of 6H SiC in the temperature range 1320-1390 C", *J. Appl. Phys.* 44 5177 (1973).

Powell, J. A., et al., "Low-temperature solid-state phase transformations in 2H silicon carbide", *J. Appl. Phys.* 43 1400 (1972).

Pusche, R., et al., "Temperature induced polytype conversion in cubic silicon carbide studied by Raman spectroscopy", J. Appl. Phys. 96 5569 (2004).

Rafaja, D., et al., "Non-metal diffusion coefficients for the Ta-C and Ta-N systems", *Acta Mater.*, vol. 46, pp. 3477-3483, 1998.

Rakhshani, A. E., "Electrode posited CdTe-optical properties", *J. Appl. Phys.*, vol. 81, pp. 7988-7993, 1997.

Reyes, M., et al., "Development of a high-rate 3C-SiC on Si CVD process", *Mater. Res. Soc. Symp. Proc.* 911 79 (2006), (abstract).

Rost, H. J., et al., "Influence of different growth parameters and related conditions on 6H-SiC crystals grown by the modified Lely method", *Mat. Sci. and Eng. B*, vol. B61-62, pp. 68-72, 1999.

Rupp, R., et al., "Silicon carbide epitaxy in a vertical CVD reactor: Experimental results and numerical process simulation", *Phys. Stat. Sol. (b)* 202 281 (1997).

Saddow, S. E., et al., "Silicon carbide CVD homoepitaxy on wafers with reduced micropipe density", *Mat. Sci. and Eng. B*, vol. 61-62, pp. 158-160, 1999.

Saidov, M. S., et al., "Study of growth conditions of silicon carbide epitaxial layers", *J. of Crystal Growth*, vol. 87, pp. 519-522, 1988.

Sautereau, J., et al., "Sintering behaviour of ultra fine NbC and TaC powders", *J. Mater. Sci.*, vol. 9, pp. 761-771, 1974.

SEMI (Semiconductor Equipment and Materials International), Standard # M550304, "Specification for polished monocrystalline silicon carbide wafers", (2007).

Sommer, M., et al., "Activity of tungsten and rhenium filaments in CH4/H2 and C2H2/H2 mixtures: Importance for diamond CVD", *J. Mater. Res.*, vol. 5, pp. 2433-2440, 1990.

Sugiyama, S., et al., "Phase relationship between 3C- and 6H-silicon carbide at high pressure and high temperature", *J. Am. Ceram. Soc.* 84 3013 (2000).

Wang, J. N., et al., "Ultraviolet-light-enhanced luminescence in SiC thin films grown on Si by hot filament chemical vapor deposition and ultraviolet-light-induced luminescence in anodized SiC", *Appl. Phys. Lett.*, vol. 74, pp. 923-925, 1999.

Watahiki, T., et al., "Low temperature epitaxial growth of Si and Si1-yCy films by hot wire cell method", *Thin Solid Films*, vol. 395, pp. 221-224, 2001.

Wiesenberger, H., et al., "Reactive diffusion and phase equilibria in the V-C, Nb-C, Ta-C and Ta-N systems", *Acta Mater.*, vol. 46, pp. 651-666, 1998.

Xie, Z. Y., et al., "Polytype controlled SiC epitaxy on on-axis 6H-SiC(0001) by adding HCl during growth", Electrochem. Solid-State Lett. 3 381 (2000).

Yamaguchi, Y., et al., "Properties of heteroepitaxial 3C-SiC films grown by LPCVD", *Sensors and Actuators A54* 695 (1996).

Yamashita, A., et al., "Homoepitaxial chemical vapor deposition of 6H-SiC at low temperatures on (01-14) substrates", *Jpn. J. Apply. Phys.* 31 3655 (1992).

Yoo, W. S., et al., "Bulk crystal growth of 6H-SiC on polytype-controlled substrates through vapor phase and characterization", *J. Cryst. Growth* 115 733 (1991).

Yoo, W. S., et al., "Polytype-controlled single-crystal growth of silicon carbide using 3C → 6H solid-state phase transformation", *J. Appl. Phys.* 70 7124 (1991).

Yoo, W. S., et al., "Single crystal growth of hexagonal SiC on cubic SiC by intentional polytype control", *J. Cryst. Growth* 99 278 (1990).

Yoo, W. S., et al., "Solid-state phase transformation in cubic silicon carbide", *Jap. J. Appl. Phys.* 30 545 (1991).

Zhao, Q., et al., "Parameters determining crystallinity in B-SiC thin films prepared by catalytic chemical vapor deposition", *J. Cryst. Growth*, vol. 260, pp. 176-180, 2004.

Zhiyong, Z., et al., "Epitaxial monocrystalline SiC films grown on Si by HFCVD at 780° C", *Mat. Sci. and Eng. B*, vol. 75, pp. 177-179, 2000.

Zielinski, M., et al., "Stress relaxation during growth of 3CSiC thin films", *Appl. Phys. Lett.* 89 131906 (2006).

\* cited by examiner

| Factor Test # | Filament Temp [°C] | Substrate Temp [°C] | Pressure [Torr] | CH4:SiH4 | H2:SiH4 | Gap [mm] | Growthrate [nm/min] | XRD FWHM [2-θ] |
|---|---|---|---|---|---|---|---|---|
| 1 | 1900 | 800 | 0.5 | 4 | 25 | 18 | 83 | 8 |
| 2 | 1900 | 1000 | 2.25 | 10 | 62.5 | 23 | 63 | 0.8 |
| 3 | 1900 | 1200 | 4 | 16 | 100 | 28 | 46 | 0.3 |
| 4 | 2100 | 800 | 0.5 | 10 | 62.5 | 28 | 41 | 8 |
| 5 | 2100 | 1000 | 2.25 | 16 | 100 | 18 | 72 | 0.5 |
| 6 | 2100 | 1200 | 4 | 4 | 25 | 23 | 61 | 0.4 |
| 7 | 2300 | 800 | 2.25 | 4 | 100 | 23 | 24 | 1 |
| 8 | 2300 | 1000 | 4 | 10 | 25 | 28 | 44 | 0.8 |
| 9 | 2300 | 1200 | 0.5 | 16 | 62.5 | 18 | 86 | 1 |
| 10 | 1900 | 800 | 4 | 16 | 62.5 | 23 | 93 | 5 |
| 11 | 1900 | 1000 | 0.5 | 4 | 100 | 28 | 35 | 3.5 |
| 12 | 1900 | 1200 | 2.25 | 10 | 25 | 18 | 89 | 0.3 |
| 13 | 2100 | 800 | 2.25 | 16 | 25 | 28 | 53 | 5 |
| 14 | 2100 | 1000 | 4 | 4 | 62.5 | 18 | 77 | 1.5 |
| 15 | 2100 | 1200 | 0.5 | 10 | 100 | 23 | 34 | 0.25 |
| 16 | 2300 | 800 | 4 | 10 | 100 | 18 | 41 | 0.8 |
| 17 | 2300 | 1000 | 0.5 | 16 | 25 | 23 | 50 | 2.7 |
| 18 | 2300 | 1200 | 2.25 | 4 | 62.5 | 28 | 28 | 1 |

Figure 5

| Growthrate Model ||||
|---|---|---|---|
| Factor | Name | Coeff | P(2 Tail) | Tol |
| Const | | 56.667 | 0.0000 | |
| B | Filament Temp | -11.333 | 0.0036 | 1 |
| C | Substrate Temp | 0.75000 | 0.8116 | 1 |
| D | Press | 2.75000 | 0.3899 | 1 |
| E | CH4:SiH4 | 7.66667 | 0.0297 | 1 |
| F | H2:SiH4 | -10.667 | 0.0052 | 1 |
| G | Gap | -16.750 | 0.0002 | 1 |

Rsq 0.8503
Adj Rsq 0.7687
Std Error 10.6419
F 10.4139
Sig F 0.0005

| Source | SS | df | MS |
|---|---|---|---|
| Regression | 7076.3 | 6 | 1179.4 |
| Error | 1245.6 | 11 | 113.3 |
| Total | 8322.0 | 17 | |

| FWHM Model ||||
|---|---|---|---|
| Factor | Name | Coeff | P(2 Tail) | Tol |
| Const | | 2.26944 | 0.0000 | |
| B | Filament Temp | -0.88333 | 0.0524 | 1 |
| C | Substrate Temp | -2.04583 | 0.0004 | 1 |
| D | Press | -1.22083 | 0.0120 | 1 |
| E | CH4:SiH4 | -0.07500 | 0.8569 | 1 |
| F | H2:SiH4 | -0.90417 | 0.0479 | 1 |
| G | Gap | 0.54167 | 0.2094 | 1 |

Rsq 0.8066
Adj Rsq 0.7012
Std Error 1.4072
F 7.6480
Sig F 0.0020

| Source | SS | df | MS |
|---|---|---|---|
| Regression | 90.9 | 6 | 15.1 |
| Error | 21.8 | 11 | 2.0 |
| Total | 112.7 | 17 | |

Figure 7

| Constant Parameter Setpoints | | |
|---|---|---|
| Substrate Temperature | 1250 | °C |
| Pressure | 4 | Torr |
| Filament to Substrate Gap | 18 | mm |
| $H_2:SiH_4$ Ratio | 50:1 | |
| $CH_4:SiH_4$ Ratio | 16:1 | |

| Variable Parameters | | |
|---|---|---|
| Test # | $SiH_4$ Flowrate (sccm) | Filament Temp. (°C) |
| E1 | 2 | 2100 |
| E2 | 4 | 2100 |
| E3 | 6 | 2100 |
| E4 | 2 | 2300 |
| E5 | 4 | 2300 |
| E6 | 6 | 2300 |

Figure 10

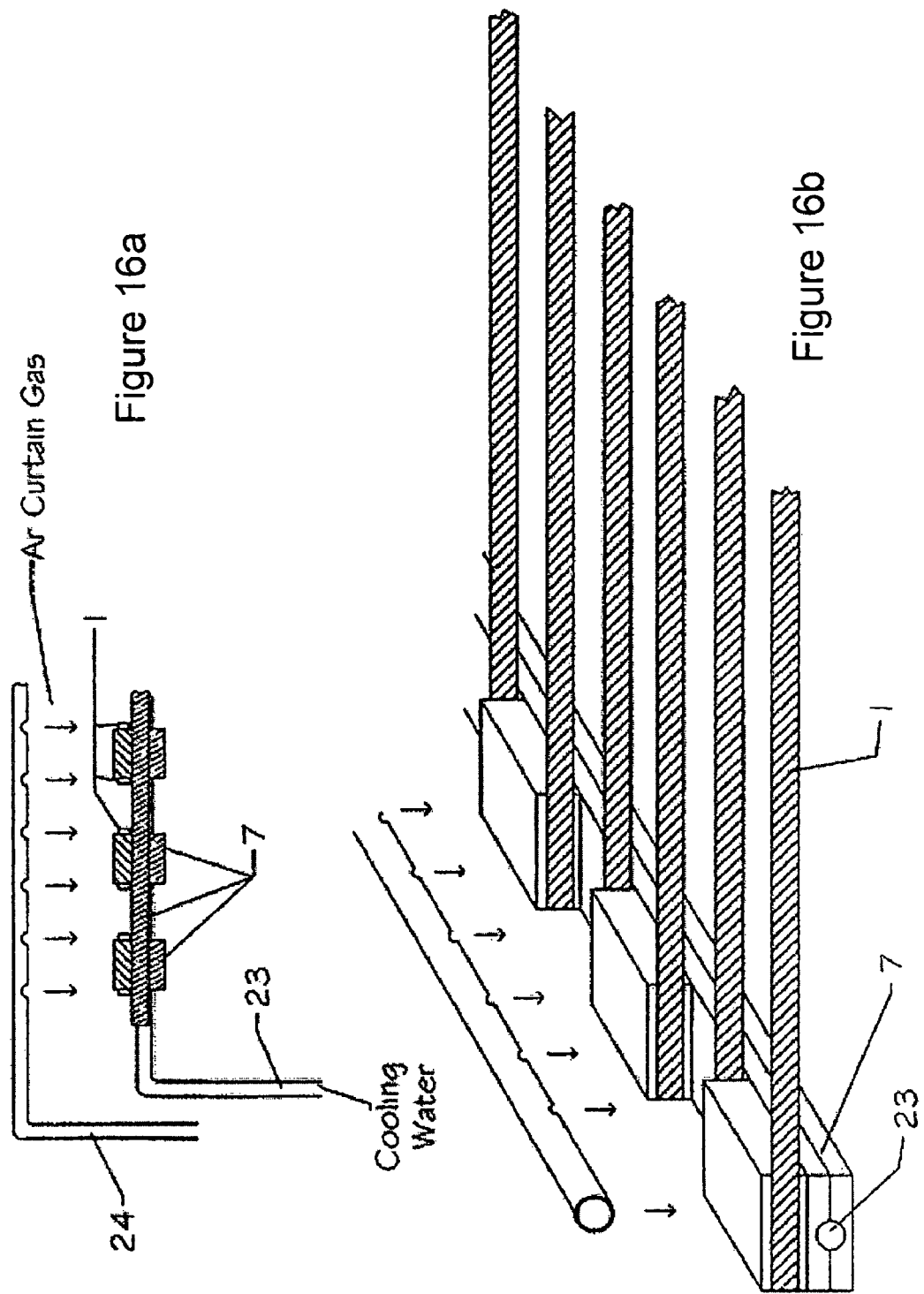

PRODUCTION OF BULK SILICON CARBIDE WITH HOT-FILAMENT CHEMICAL VAPOR DEPOSITION

CROSS-REFERENCES TO RELATED APPLICATIONS

This application claims the benefit of U.S. Provisional Application No. 60/954,789 to Robbins et al, filed Aug. 8, 2007, the entire contents of which are herein incorporated by reference for all purposes.

STATEMENT AS TO RIGHTS TO INVENTIONS MADE UNDER FEDERALLY SPONSORED RESEARCH OR DEVELOPMENT

This invention was developed at least partially with United States Government support under Grant No. 0637287 and Grant No. 0750064 from the National Science Foundation. The United States Government may have certain rights in this invention.

FIELD OF INVENTION

The present invention in general relates to the growth of silicon carbide boules. More specifically, the present invention relates to methods and apparatuses for growing silicon carbide boules using a hot-filament chemical vapor deposition system.

BACKGROUND OF THE INVENTION

Silicon carbide has superior properties regarding high-power, high-frequency, and high-temperature electronics, when compared to today's commercially available semiconductors. The main advantage of using SiC over other semiconductors is its high bandgap of ~3 eV, more than double that of Si or GaAs. Additionally SiC has a high thermal conductivity. The high bandgap allows the device to operate at increased temperatures without electron excitation from the valence to conduction band. Also, the combination of high bandgap and high breakdown field allows for extremely high power densities. SiC is physically rugged and chemically inert, which is an advantage when operating in harsh environments.

To take advantage of the properties of SiC, high-quality large-area boules with low defect densities must be produced economically. To date most bulk SiC is grown using seeded sublimation techniques, also known as modified Lely methods. The technique was first introduced by J. A. Lely, U.S. Pat. No. 2,854,364, and has been improved upon throughout the years as shown by Davis et al, U.S. Pat. No. 4,866,005. Boules with diameters up to 100 mm grown employing this technique are commercially available. For this process a graphite crucible is typically heated to 2000-2400° C. Solid SiC source material is evaporated and redeposited on a SiC seed substrate, which is controlled at a slightly lower temperature. Growth rates using the seeded sublimation technique are reported to range from 50-1000 μm/hr. Despite major development efforts over many years, several quality issues pertaining to the high temperatures required for boule formation remain.

Seeded sublimation techniques have several disadvantages: First, contamination from the graphite crucibles and source material lead to unacceptable impurity levels in the bulk crystals. These impurities lead to high unintentional carrier concentrations in the material. High resistivity wafers required for several applications remain extremely expensive. Additionally, high levels of defects in the crystal remain a concern. SiC boules produced by sublimation contain high dislocation densities, micropipes, mosaic structures, and stress fields, resulting from the chamber materials and the high temperatures required for growth. Inhomogeneous temperature distribution increases the probability of graphite inclusion or Si droplet formation, which can lead to micropipes and other defects Particles shedding from the graphite crucible have also been observed as a significant culprit for defects. Reduction of the defect density of boules grown using seeded sublimation techniques have been attempted using variations of chamber geometries, crucible materials, and processing conditions, see U.S. Pat. Nos. 6,534,026 and 6,562,130. Finally, the geometries associated with this technique make it extremely difficult to produce large diameter boules due to nonuniform temperatures in the boule and source material as the diameter of the sublimation system increases.

Another technique now being explored for the formation of bulk SiC is liquid phase epitaxy (LPE). In this process large diameter boules are pulled from highly purified molten material. Most bulk semiconductor materials, such as Si, are produced using this technique. Major advantages of this technique include polytype stability and low defect density, but the low solubility of carbon at reduced temperatures and the high silicon vapor pressure make this method difficult for growing silicon carbide boules. Also, silicon is very reactive at high temperatures and no suitable crucible material has been found. Producing SiC boules in this fashion would require temperatures of ~3200° C. at a pressure of $10^5$ bar. These factors have so far made LPE growth impractical: see D. H. Hofmann and M. H. Muller, *"Prospects of the use of liquid phase techniques for the growth of bulk silicon carbide crystals"*, Mat. Sci. and Eng. B, vol. 61-62, pp. 29-39, 1999.

In still another technique, single crystal SiC samples up to 2 mm thick have been grown with quality comparable to crystals grown by seed sublimation using high-temperature chemical vapor deposition (HTCVD), also referred to as hot-wall CVD. This method is provided by Kordina et al, U.S. Pat. No. 5,704,985 and Ellison et al., *"High temperature CVD growth of SiC"*, Mat. Sci. and Eng. B, vol. 61-62, pp. 113-120, 1999. In HTCVD, high-purity semiconductor grade gases are reacted to form the SiC. The reactions typically occur in graphite walled chambers where the walls and the seed crystal are generally maintained at temperatures >2000° C. At these temperatures, growth rates of 600 μm/hr have been achieved. HTCVD takes advantage of the availability of low-cost gas supplies which have much higher purity than the solid SiC sources used in sublimation. The reduction of impurities in the starting material will facilitate growth of SiC with reduced defect density and carrier concentration in the bulk. Also sublimation techniques are usually batch processes, which limit the potential length of the boule. Conversely in HTCVD the gas supply is essentially inexhaustible with the correct set-up, and the flowrates can be continuously tightly controlled, which makes the potential boule length only limited by the chamber design. However, many of the same problems associated with evaporation techniques will occur with HTCVD, such as high levels of impurities in the SiC from the graphite walls, and stress on the crystal formed due to the high growth temperatures. In addition, the reactions that occur at the walls of HTCVD reactors limit the diameter of uniform growth due to heat and mass transfer considerations.

The main polytypes, or crystal orientations, discussed for SiC boules are 3C, 4H, and 6H. 3C has a cubic structure, whereas 4H and 6H have hexagonal crystal structures. Sublimation and HTCVD techniques generally produce 4H and 6H polytypes, but not 3C, due to the high temperatures required for growing boules.

Traditional chemical vapor deposition (CVD) methods have been utilized to grow thin epitaxial layers of SiC on a variety of substrates. The majority of the SiC thin films deposited in industry are done by plasma enhanced CVD (PECVD), which are used for etch stop/diffusion barrier layers in integrated circuits. Generally these thin films are amorphous or polycrystalline, although some work has been carried out on the growth of single crystal thin films. In thermal CVD precursor gases are delivered to a heated substrate where reactions occur forming a growth layer. This technique has been used to produce single crystal 3C—SiC using $SiH_4$, $C_3H_8$, and $H_2$ precursors at a substrate temperature of 1400° C., see S. Nishino et al., "Production of large area single crystal wafers of cubic SiC for semiconductor devices", *Appl. Phys. Lett.* 42 460 (1983). Although thermal CVD can produce single crystal layers, growth rates of SiC tend to be too low for the economic production of boules. Hot filament CVD (HFCVD) has also been shown to produce epitaxial layers of single crystal 3C—SiC at temperatures as low as 780° C., see Z. Zhiyong et al., "*Epitaxial monocrystalline SiC films grown on Si by HFCVD at 780° C.*", *Mat. Sci. and Eng. B*, vol. 75, pp. 177-179, 2000. The substrate temperature for these depositions are in sharp contrast to sublimation and HTCVD techniques, which require substrate temperatures in excess of 2000° C. The prior art shows that the HFCVD technique can produce monocrystalline SiC in layers that are relatively thin, but the systems used for the growth of thin layers are not designed to deposit for the length of time required to grow boules. Also these systems will have contamination and growth time issues associated with the filaments at temperatures required to produce the growth rates needed for economic boule growth.

The advantages of SiC devices have yet to be extensively realized on a commercial level because of the technology for growing SiC boules used to produce substrates is relatively immature. Despite years of optimization efforts, the sublimation techniques used to produce most commercial SiC wafers continue to be plagued by high contamination and defect levels. Also, the adoption of SiC as a substrate material has been limited by the high cost and small diameters of the wafers currently available. Thus there is a need for new methods and systems to produce high-quality bulk SiC crystals. This and other needs are addressed by the present invention.

BRIEF SUMMARY OF THE INVENTION

Embodiments of the invention include a durable apparatus and repeatable method for controlled growth over extended periods of time of high quality silicon carbide crystal of a desired polytype upon a substrate surface. The silicon carbide crystal may be embodied as a boule of silicon carbide, where a "boule" may be considered a synthetic formed mass with atomic structure being largely single crystal. The boule may have sufficient thickness so that it can be used to produce freestanding wafers, gemstones or other macroscopic objects.

Embodiments also include a method and apparatus of growing high quality monocrystalline silicon carbide by the passing of gas precursors across heated filaments which can be operated at temperatures in excess of 2000° C. (e.g. for example 2000, 2100, 2200, 2300, 2400, 2500, or 2600° C., or temperatures in between these values) where the gas precursors decompose into reactive intermediates which produce SiC on the substrate.

Embodiments further include a method and apparatus of growing high quality monocrystalline silicon carbide of all polytypes to lengths and diameters that are commercially valuable, including lengths ranging from about 0.25 inches or more, about 0.5 inches or more, about 1 inch or more, about 2 inches or more, about 3 inches or more, etc. For example the length may range from about ½ inch to 24 inches, 1 inch to 24 inches, 2 inches to 24 inches, etc. The diameters may range from about 3 inches to diameters of about 20 inches or more, (e.g. about 4", 5", 6", 7", 8", 9", 10", 11", or 12" in diameter, about 8" in diameter, up to about 12" diameter, up to about 20" diameter, etc.).

Embodiments also include a method and apparatus of growing high quality monocrystalline silicon carbide by producing SiC boules which yield wafers at a lower cost than methods currently available by using low cost starting materials, increasing the length of time the growth chamber and internal components are operationally viable (e.g., for more than about 1, 2, 3, 4, 5, 6, 7, or 8 weeks, etc.), increasing the proportion of the resulting boules which have lower defect ratios, and increasing the length of boule produced to gain economic advantage with downstream processing systems.

Embodiments still further include a method and apparatus of growing high quality monocrystalline silicon carbide with gas precursors thereby improving the SiC produced by a reduction in impurities in the starting material and reducing the defect density and tightly controlled carrier concentration in the crystal produced.

Embodiments yet also include a method and apparatus of growing high quality monocrystalline silicon carbide by decoupling the gas-phase temperature and substrate temperature so that the temperature of the SiC boule can remain low during growth to maintain crystal quality.

Embodiments still also include a method and apparatus of growing high quality monocrystalline large diameter silicon carbide with a separated filament array and heated substrate mechanism which can be moved to regulate the distance from the filaments to the substrate to further improve the quality of the resulting crystal.

Embodiments further include a method and apparatus of growing high quality monocrystalline large diameter silicon carbide with reduction in defects caused by cooling of the material produced by precisely controlling substrate temperature to the lowest practicable and still achieve desired growth rate and other qualitative objectives with controlled cooling of the substrate upon completion of the deposition.

Embodiments still also include a method and apparatus of growing high quality monocrystalline large diameter silicon carbide wherein crystal quality and defect density are favorably influenced through precise control of the combination of relevant variables including but not limited to filament temperature, substrate temperatures, temperatures across the diameter of the active surface of the growing crystal, gas flow rates, gas concentrations, chamber pressure, and distance from substrate to filaments.

Embodiments additionally include a method and apparatus of growing high quality monocrystalline large diameter silicon carbide with reduced or eliminated impurities by isolating the reactive elements and product of the apparatus and method from external contamination, including from the reaction chamber walls or other sources of unintentional doping or impurities.

Embodiments yet further include a method and apparatus of growing high quality monocrystalline silicon carbide wherein gas mixtures can be accurately delivered, yielding tight control of dopants concentration in the growing boule. (e.g. an aluminum containing gas precursor can be introduced into the gas flow for p-type doping, and/or a nitrogen containing compound can be introduced into the gas flow for n-type doping).

Embodiments still additionally include a method and apparatus of growing high quality monocrystalline large diameter silicon carbide with improved economic efficiency both with respect to actual cost of the growth process and reduction in defects in end-product.

Embodiments also include an apparatus and method for growing large diameter single crystal high quality SiC for use in semiconductor, electrical device, jewelry manufacture and other purposes. Embodiments of the method may include the introduction of a seed crystal of a particular polytype upon a substrate heater. This substrate is then raised in temperature coincident with the raising of temperature of the filaments located above and in close proximity to the substrate. Upon achieving desired temperatures, the gas precursors may be flowed across the filaments thereby creating a chemical reaction which forms the desired compounds for forming silicon carbide. Following continuation of this process for the desired amount of time to achieve the desired crystal length across the entirety of the diameter, the apparatus may be stopped through a series of precise steps or continuous (e.g., analog) change to reduce or eliminate defects normally associated with cooling whereby the crystal is removed from the apparatus and processed into the desired size(s) and shape(s).

Embodiments of the invention still further include methods to grow a boule of silicon carbide. The methods may include flowing a silicon-containing precursor and a carbon-containing precursor proximate to a heated filament or array of heated filaments, and forming the silicon carbide boule on a substrate from reactions of the heated silicon-containing and carbon-containing precursors. The silicon carbide boule may be grown at two or more different growth rates by adjusting flow rates as well as the distance between the substrate and the heated filament.

Embodiments of the invention also include apparatuses for growing a silicon carbide boule. The apparatuses may include a deposition chamber to deposit silicon carbide on a substrate, and a precursor transport system for introducing silicon-containing and carbon-containing precursors into the deposition chamber. The apparatuses may also include at least one filament capable of being heated to a temperature that can activate the precursors, and a substrate pedestal to hold a deposition substrate upon which the silicon carbide boule is grown. The pedestal may be operable to change the distance between the substrate and the filament as the silicon carbide boule is grown.

Embodiments of the invention may still further include methods to deposit a crystalline silicon carbide boule on a substrate. The methods may include placing the substrate into a hot-filament chemical vapor deposition reactor, and depositing the crystalline silicon carbide on said substrate. The depositing step may include thermally activating gaseous deposition precursors and reacting the activated precursors to form the silicon carbide. The method may also include adjusting the distance between the substrate and a heated filament in the reactor, where a rate of deposition of the silicon carbide on the substrate varies as a distance between the substrate and the filament is varied.

Embodiments of the invention may yet further include a silicon carbide boule having a largest diameter of about 4 inches or more. The boule may be formed by a method that includes flowing a silicon-containing precursor and a carbon-containing precursor proximate to a heated filament, and forming the silicon carbide boule on a substrate from reactions of the heated silicon-containing and carbon-containing precursors.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

FIG. 5 shows the setpoints and responses for a Taguchi L18 Design Of Experiments (DOE);

FIG. 7 shows the multiple regression models for the growth rate and x-ray diffraction (XRD) measurements;

FIG. 10 shows the deposition conditions for the individual parameters Design Of Experiments;

FIGS. 16A & B show a detailed view of the filament assembly according to embodiments of the invention.

DETAILED DESCRIPTION OF THE INVENTION

Methods and systems are described for the deposition of bulk silicon carbide (SiC) boules using hot-filament chemical vapor deposition (HFCVD).

Figure 1:
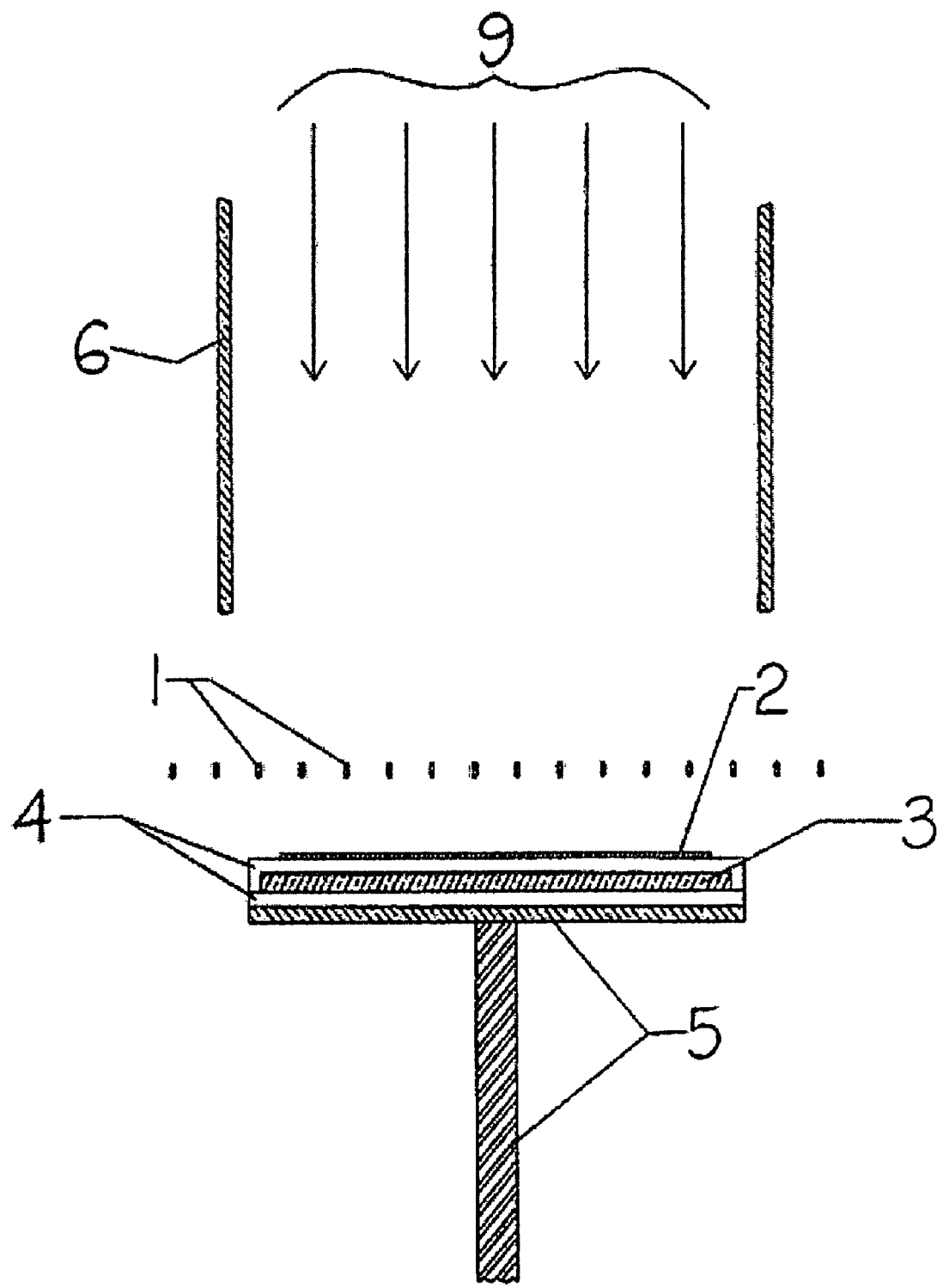
FIG. 1 shows a cut-away side-view of selected components of a hot-filament system for HFCVD according to embodiments of the invention.

As depicted in FIG. 1, HFCVD techniques involve the passing of gas precursors 9 across heated filaments 1, where the precursors decompose into reactive intermediates which react with the heated substrate surface 2. Hot-filament chemical vapor deposition (HFCVD) allows the temperatures of the filaments and the substrate to be independently adjusted to permit the growth of large-scale SiC boules. Because the gas-phase temperature can be decoupled from the substrate, the substrate temperature can be reduced relative to sublimation, yielding materials with lower stress defects following a return to ambient temperature. The reduction in overall temperature variation from the chamber's deposition temperature to room temperature for additional processing can substantially reduce stress related defects in the boule. The ability to grow boules at reduced temperatures also allows for the growth of the 3C polytype SiC. As the boule grows, the distance from the hot filaments 1 and the SiC boule surface 2 may be altered continuously throughout the process to maintain optimum growth rate and quality of crystal. Additionally the issues associated with graphite walls are eliminated because only the filaments 2, which are heated by electrical current, are heated to extreme temperatures.

The use of high-purity gas precursors using HFCVD has the potential to produce SiC boules with low contamination levels and reduced defect levels at a reduced cost. Because the supply of gas precursors is essentially inexhaustible, boule length is only limited by chamber design. Gas mixtures can be accurately delivered, yielding tight control of dopant concentration in the growing boule. For example, an aluminum containing gas precursor can be introduced into the gas flow for p-type doping, and/or a nitrogen containing compound can be introduced into the gas flow for n-type doping. HFCVD systems are operated at reduced pressure (e.g., 1-200 Torr), which provides enhanced transport of the reactive intermediates.

Figure 2:
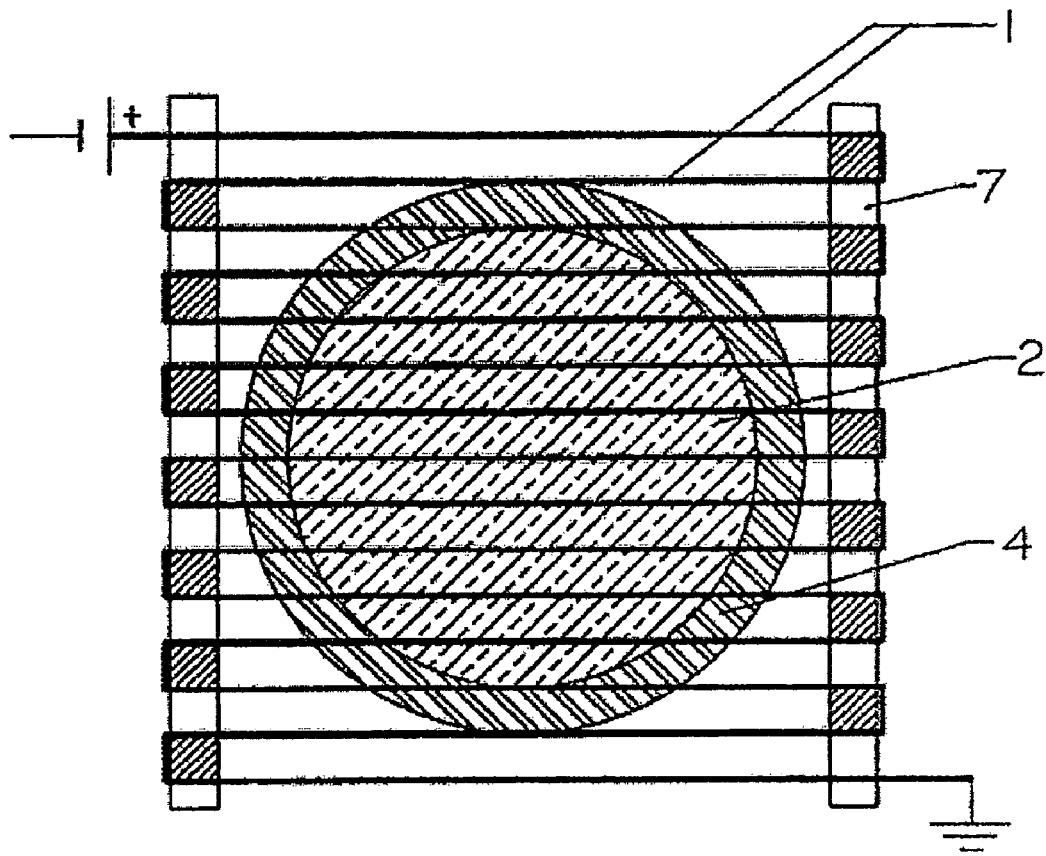
FIG. 2 shows a top-view perspective of the hot filament array according to embodiments of the invention.

As depicted in FIGS. 1 and 2, the filaments 1 may be spaced laterally, parallel to the SiC growth surface 2 allowing for uniform temperature on the surface and uniform delivery of activated precursors across large diameters of the substrate. The HFCVD geometry allows for uniform deposition over large areas, and is thus capable of scaling up for production of large diameter boules. The independent heating of the precursors 9 and the boule 2 through the use of filaments 1 and a substrate heater 3, 4, allows for the deposition of SiC boules of all polytypes (3C, 4H, 6H, 15R, etc.) that can be grown at commercially valuable diameter sizes (e.g., from about 2" to about 12" in diameter; about 2", 3", 4", 5", 6", 8", 10", 11", or 12" in diameter, about 8" in diameter, up to about 12" diameter, up to about 20" diameter, etc.), lengths (e.g., 0.5" up to about 24") and quality. This capability arises from establishing separate control of production variables such as filament temperature, substrate temperature, precursor supply, and distance between the filaments and the crystal growth on the substrate, among other variables. The system may be designed to reduce and/or eliminate stress on the chamber and internal components from the high temperatures involved, allowing the system to grow boules of any length in a single, continuous step. For example, boules may be continuously grown for periods of time from 1 hour up to several weeks (e.g., for more than about 1, 2, 3, 4, 5, 6, 7, 8 weeks, etc.) to produce boules of significant thickness.

In FIG. 2 the filaments 1 are electrically connected in series. This reduces the current required to reach the necessary temperature of the filaments while increasing the required voltage. The filaments can also be electrically connected in parallel which lowers required voltage, but increases the required current.

Additional details of HFCVD for SiC boule formation is explained in the remainder of this section.

Exemplary Chambers

Figure 3:
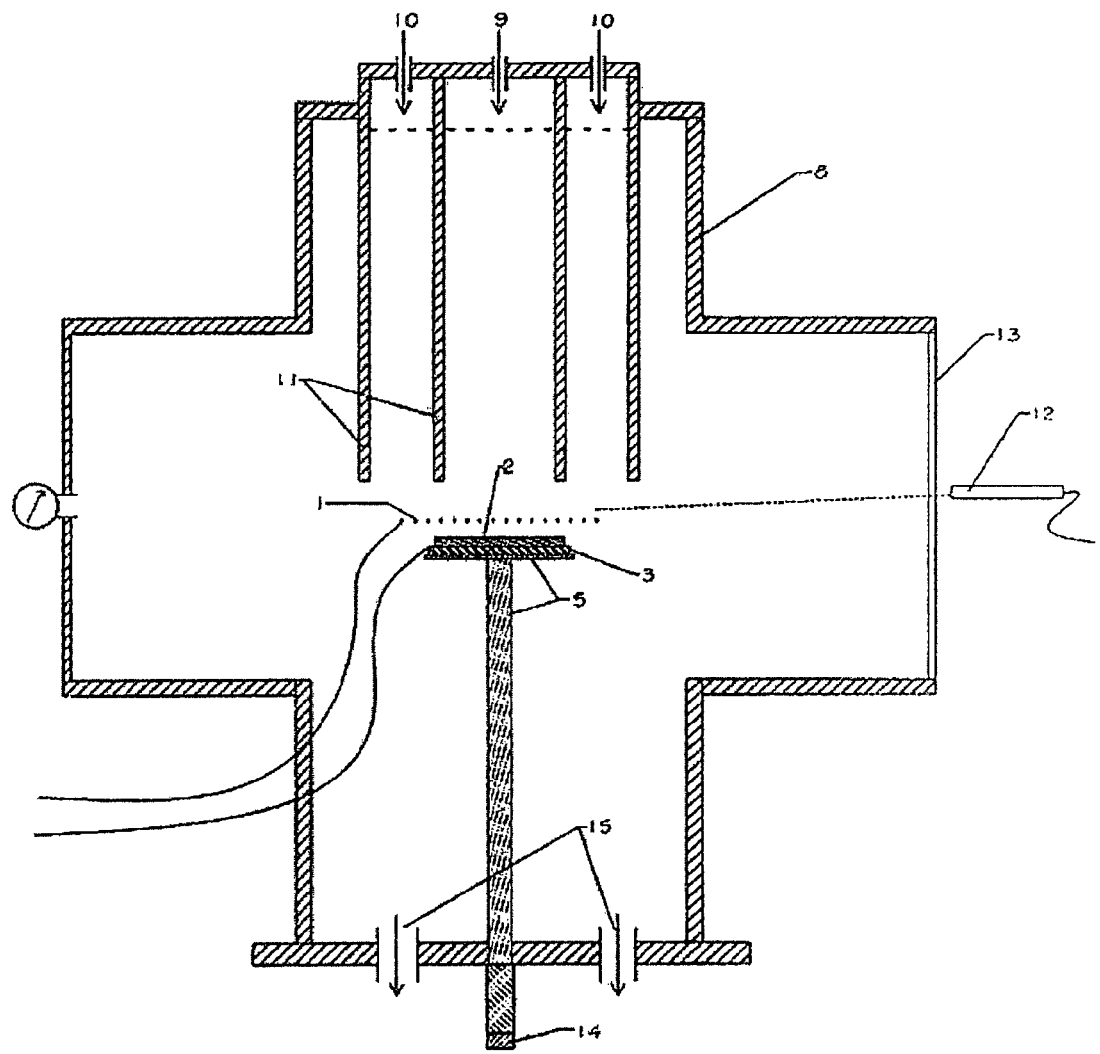
FIG. 3 shows a cut-away side-view of a general schematic of a deposition chamber to be used for growing SiC boules according to embodiments of the invention.

FIG. 3 shows a side view of a general schematic of a chamber to be used for growing SiC boules according to embodiments of the invention. The chamber geometry may be such that unreacted precursors will flow away from the substrate 2 and defects within the boule will be reduced. The chamber shell may resemble a 4-way stainless steel cross 8. The gases may enter the system through two concentric cylinders 11. Reactant gases 9 may enter through the center cylinder, which has a 2" diameter. The outer 3" cylinder may be used for Ar curtain gas 10. The curtain gas may serve several functions, including: 1) shielding the edge of the hot-filament assembly from contact with the deposition precursors, which is often a source of material build-up and therefore particle formation; and 2) maintaining the purity of the reactive precursors reaching the substrate and reduce contamination for the substrate heater 3. The depth of the inlet cylinder 11 may be adjustable for control of the inlet to filament spacing. Additional deposition chambers may include the removal of the inlet gas cylinder 11, and the introduction of the precursors from the side or below the substrate.

The hot filament assembly may use tantalum ribbons as filaments 1. The ribbons may be connected to a dc power supply capable of producing currents that will be able to heat the ribbons to ~2500° C. A steel frame may be used to mount the ribbons under slight tension to insure proper alignment of the filament. Ceramic tubes may maintain uniform spacing between the filament segments, ensure electrical isolation from the frame, and reduce heating of the steel frame. To minimize edge effects, the area of the ribbon array may be larger than the inlet gas diameter. Round filaments or wire may also be used in addition to (or in lieu of) ribbon shaped filaments. Examples of filament shapes may also include flat filaments. The filament temperature may be measured using a calibrated pyrometer 12 located outside a quartz window 13. The window may also be constructed of glass, pyrex, sapphire, etc.

SiC substrates may be placed on a Proportional-Integral-Derivative (PID)-controlled resistive heater 3. The position of the substrate assembly 5 may be adjustable using a linear motion feedthrough 14 with a 2" range of motion to control the gap between the substrate and filament array. Mass flow controllers may control the flowrates of all precursors and carrier gases. The system may be exhausted through two 1" diameter exhaust ports 15 underneath the substrate assembly. The pressure may be controlled by an automatic butterfly valve located in the exhaust line. Circulated cooling water in contact with the inlet cylinders 11, substrate assembly 5, and chamber walls 8 may be used to maintain functional temperatures of these components.

Figure 4A:
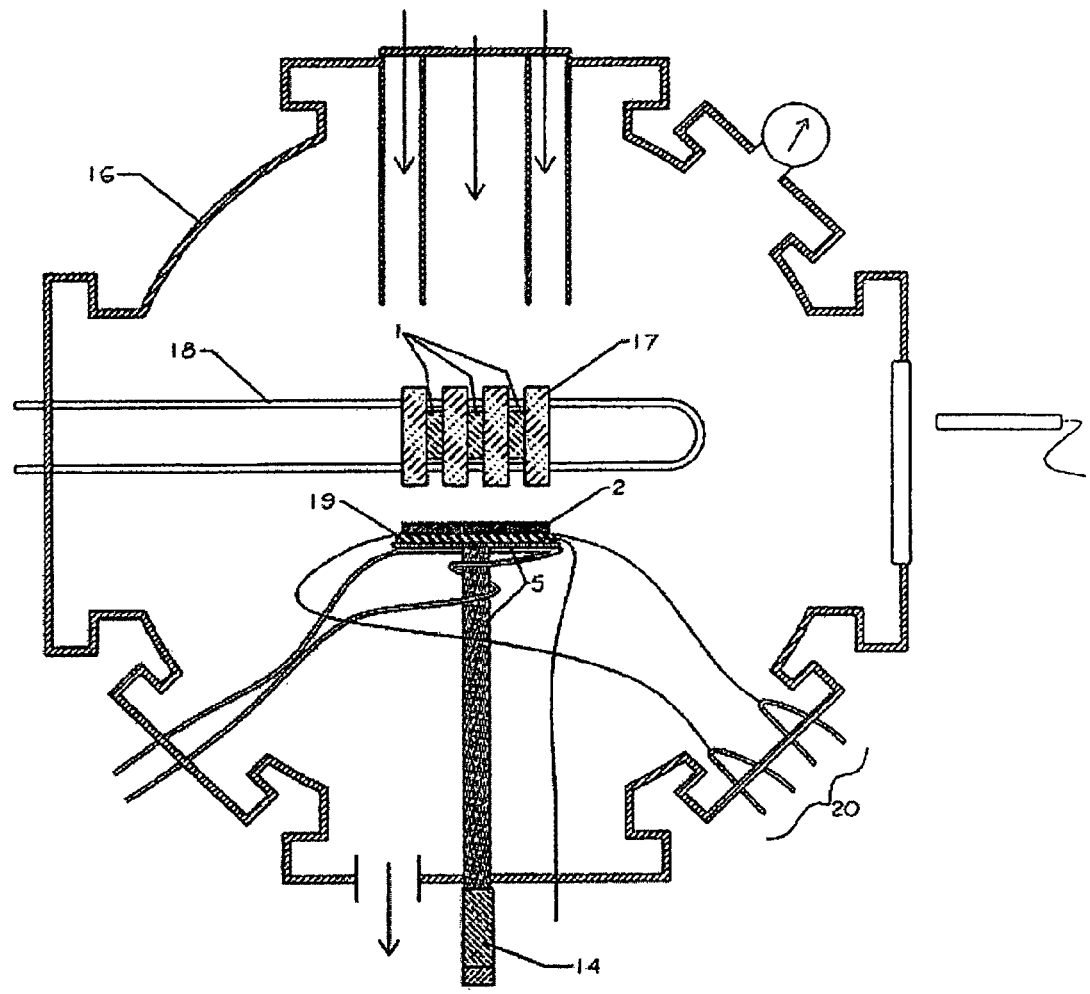
FIG. 4A is a cut-away side view of a deposition chamber for growing SiC according to embodiments of the invention.
Figure 4B:
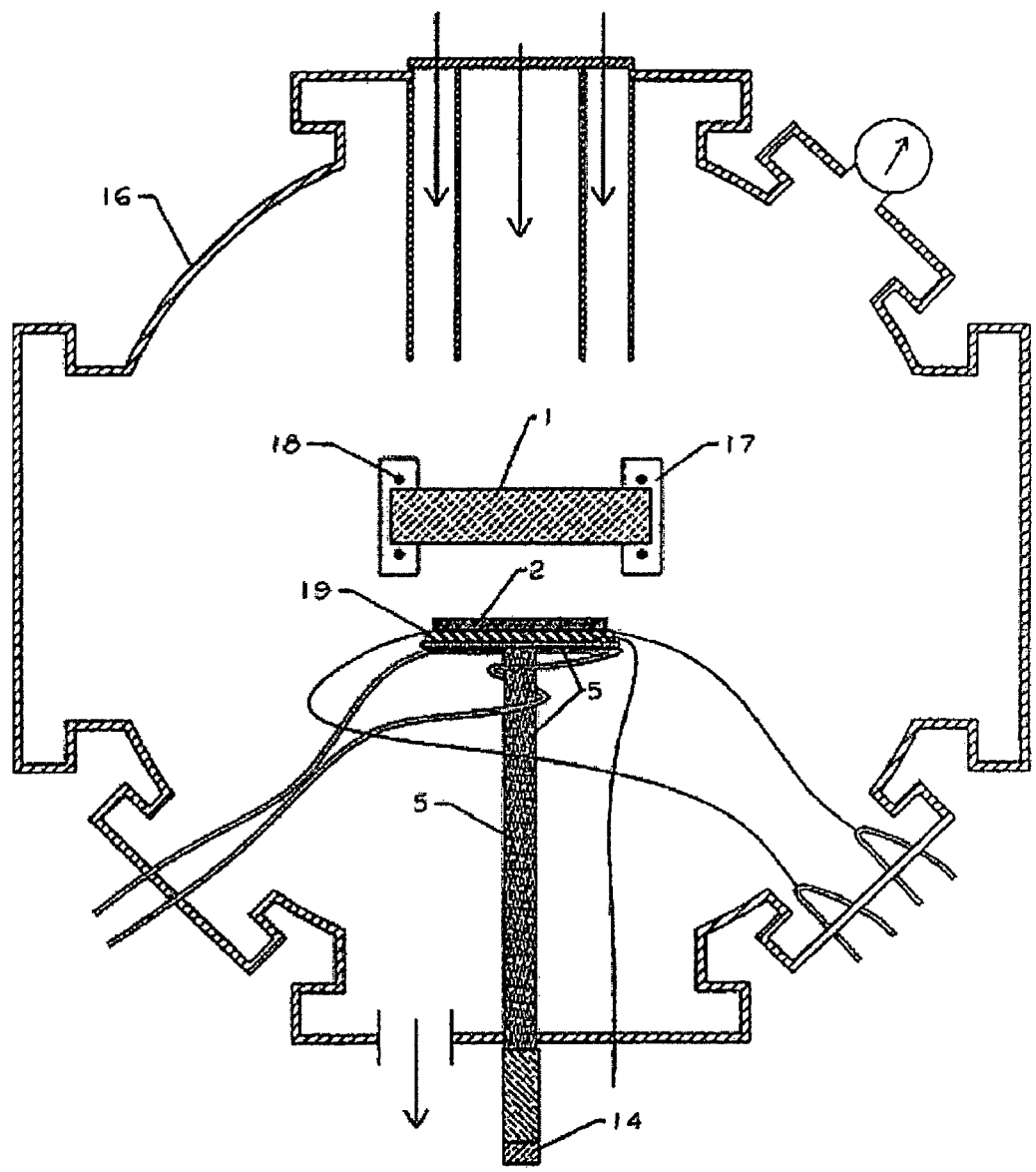
FIG. 4B shows a view at a right angle from FIG. 4A.

FIGS. 4A & B show another example of a chamber to be used for growing SiC boules according to embodiments of the invention. The chamber was designed with the ability to individually adjust and measure parameters for the growth process. These parameters included: precursor flowrate, chamber pressure, filament temperature, substrate temperature, filament to filament spacing, and filament to substrate gap.

The chamber shell may include a standard 12" generally spherical chamber 16 with 11 ports. To maintain the shell temperature of <100° C. during deposition, chilled water was circulated through copper tubing which was wrapped around the chamber. Thermal contact between the shell and the copper tubing was enhanced by the use of heat conducting putty around the copper tubing. The gases enter the chamber through an annulus with a center diameter of 50 mm and outer diameter of 100 mm. A gas manifold allows independent control of carrier and reactant gases through the center and outer ring of the annulus. Ultra-high purity grade Ar, $H_2$, $CH_4$, and 10%—$SiH_4$/90%-$H_2$ may be used. Flowrates may be controlled using mass flow controllers. The chamber pressure may be controlled using an automatic butterfly valve located in the exhaust system prior to a vacuum pump.

The filament assembly is shown at 90° angles in FIGS. 4A & B to clarify the set-up. The filaments 1 may include high purity tantalum ribbons with dimensions of 1.5 mm×4 mm×100 mm. In the embodiments shown in FIGS. 4A & B, three filaments 1 are spaced 13 mm apart. The filaments may be clamped between aluminum blocks 17. These aluminum blocks 17 may be clamped to water-cooled copper tubing 18, which supply a voltage across the filaments while maintaining reduced temperature for the filament assembly. The electrical feedthrough 20 may be isolated copper tubing connected to the power supplies and may be cooled with water from a recirculating chiller. In the embodiment shown, the filaments 1 were connected in parallel and used a high current and low voltage to control the filament temperature. For example to maintain filament temperatures of 2300° C., a total current of ~510 A (@ 4 V) was used. Three power supplies connected in parallel were used to supply the current to the filaments 1. The substrate 2 may be clamped to a boron nitride coated resistive heater 19 capable of maintaining temperatures of ~1700° C., with a 50 mm diameter uniform heating area. The heater may be clamped to an alumina plate that may be attached to a water-cooled steel assembly. The entire substrate assembly 5 may be connected to a variable height feedthrough 14, which may be used to control the filament to substrate distance.

The electrical connections 20 may be made using graphite washers and tantalum electrical wires. The substrate temperature may be measured with an R-type thermocouple placed between the heater and alumina plate. A PID-controller may be used to control and maintain the substrate temperature.

SiC Boule Growth

The complexities of HFCVD systems create challenges for identifying the effects of specific process parameters within the process space to optimize a growth process. Reactant concentrations, substrate temperature, filament temperature, flowrate, pressure, etc. are often coupled. Investigations of these interactions to optimize growth processes were conducted with a system similar to the one illustrated in FIGS. 4A & B. Some results of these investigations are described here.

First, the results of a screening Design Of Experiments carried out to identify important parameters for growth rate and crystallinity are discussed. Next, an evaluation of individual deposition parameters is discussed. Then, depositions on 6H and 4H polytype SiC substrates are discussed.

(A) Screening Design of Experiments

A.1.1 Experimental Description

The reactor for this work was an HFCVD system similar to the embodiment illustrated above in FIGS. 4A & B. The substrates were 50 mm diameter, <111> oriented Si. Due to the large number of variable parameters a three-level Taguchi L18 was chosen as a screening design of experiments (DOE). Six main factors were examined for their effect on growth rate and crystallinity: Filament temperature (1900-2300° C.), substrate temperature (800-1250° C.), chamber pressure (0.5-4 Torr), $CH_4$:$SiH_4$ ratio (4:1-16:1), $H_2$:$SiH_4$ ratio (25:1-100:1), and filament to substrate gap (18-28 mm). Screening experiments such as this one are used to determine whether the variable factors have a significant effect on the selected response, so that the number of factors can be reduced for optimization of the response in future experiments. $SiH_4$ flowrate was held constant at 2 sccm (standard cubic centimeters per minute), and filament to filament spacing was set at 13 mm. The primary responses evaluated in the DOE were growth rate and crystallinity. The data were analyzed using a commercial statistical software package.

A.1.2 Test Results and Discussion

FIG. 5 below details each deposition recipe and the results for this Taguchi L18 DOE.

Figure 6:
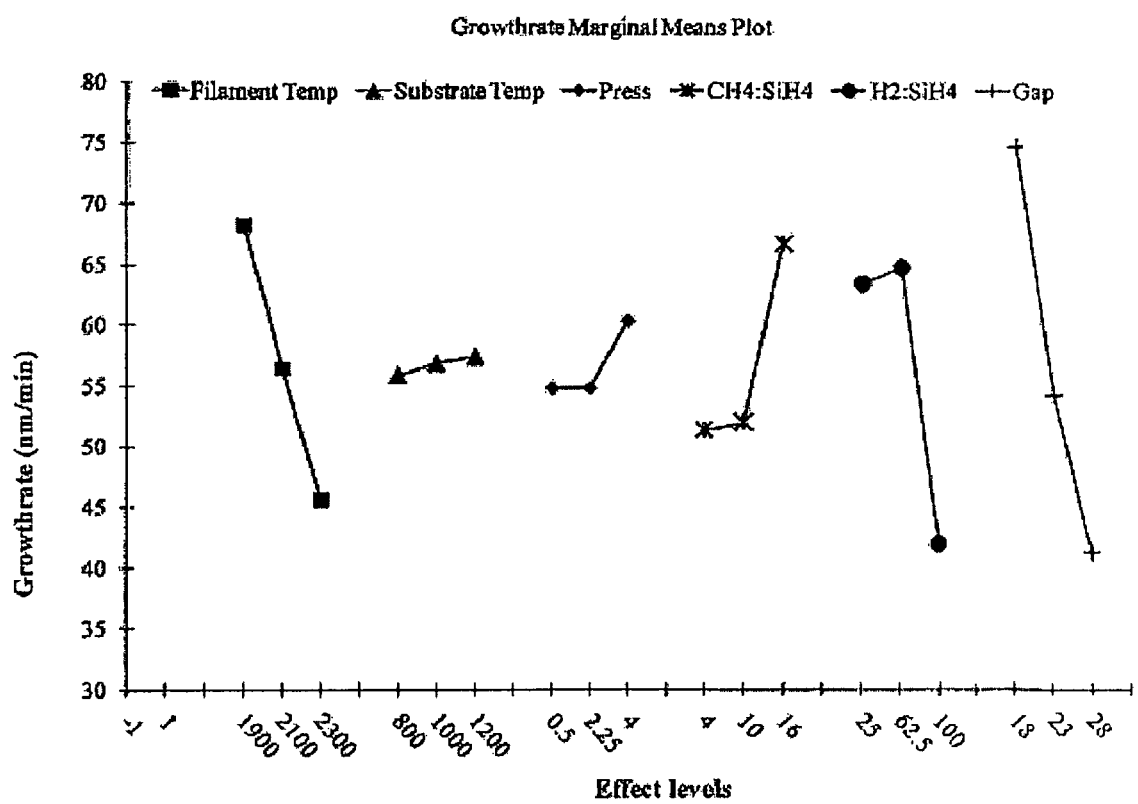
FIG. 6 shows a marginal means plot for growth rate from the Design Of Experiments.

First, the effect of the parameters on SiC growth rate was examined. The film thickness was measured using a scanning electron microscope (SEM). The growth rate marginal means plot and multiple regression models for this DOE are given in FIGS. 6 & 7, respectively. In the multiple regression model of the main factors (FIG. 7), the key result from the analysis is the P(2 tail), which is the probability of placing an insignificant term in the model. As a rule of thumb, factors with P values of <0.10 are considered significant; filament temperature, $CH_4$:$SiH_4$ ratio, $H_2$:$SiH_4$ ratio, and filament to substrate gap were all statistically significant in this case for growth rate. A marginal means plot (FIG. 6) is simply a plot of the average at each setpoint for each effect. From the marginal means plot, it is clear that filament temperature and gap have a large effect on the growth rate, while the effects of substrate temperature and pressure were less. Overall, the growth rates were fairly low compared to what would be required for successful boule growth. One important factor that was held to a conservative level and not tested in this DOE was $SiH_4$ flowrate (2 sccm). This effect is detailed in the next section.

Figure 8:
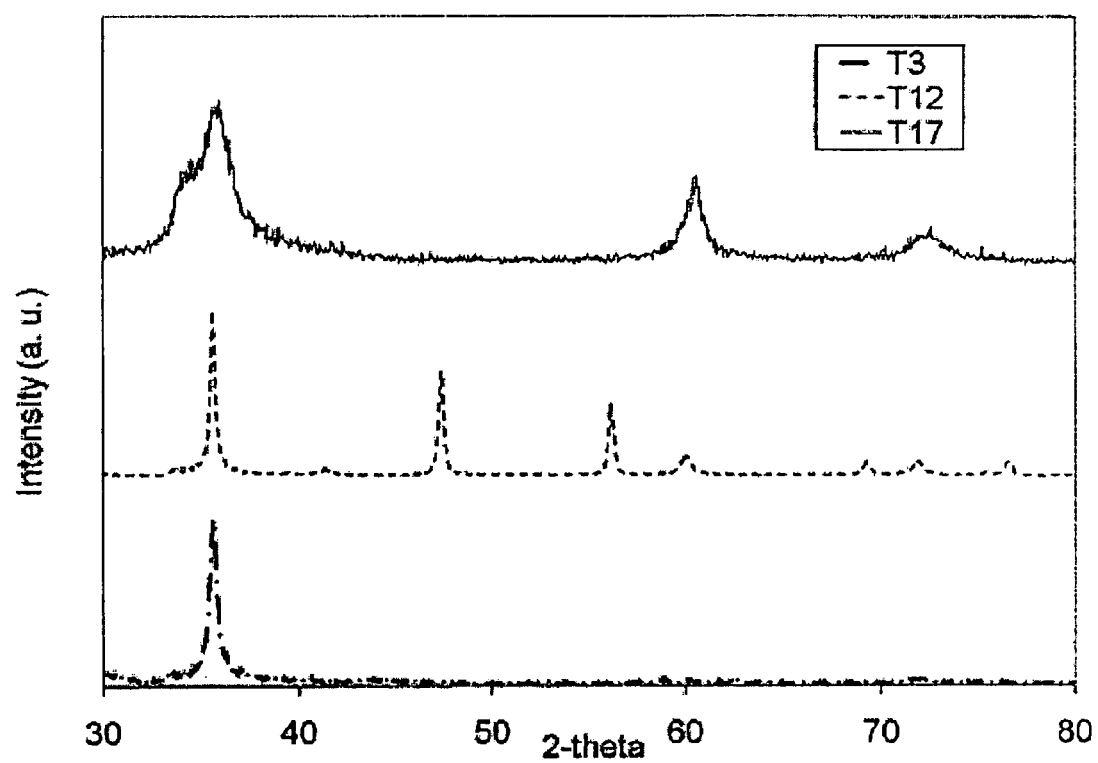
FIG. 8 shows example X-Ray Diffraction results from selected samples of the DOE.

Next an analysis of the film crystallinity was carried out. The X-ray diffraction (XRD) spectra in this test set show that the films ranged from highly-oriented exclusively 3C polytype, to unoriented cystallites and/or mixed polytype films, to highly disordered films with broad diffraction peaks. An example of each of these is provided in FIG. 8. The spectra shows the sample labeled T17 has very broad peaks indicating disorded polycrystalline SiC, T12 has multiple peaks at many positions indicating multiple polytypes and orientations, and sample T3 has a sharp single peak at 2θ=35.6° indicating high ordered 3C SiC oriented in the (111) direction. For our evaluation the full-width-half-maximum (FWHM) of the 3C polytype (111) peak (2θ=35.6°) was used as the quantitative indicator of the quality of the 3C polytype SiC. Small FWHM values indicate better crystallinity, that is, the film is of a single polytype with large grain size. Films with small grains, high stress, and mixed polytype would have an increased FWHM for this peak.

Figure 9:
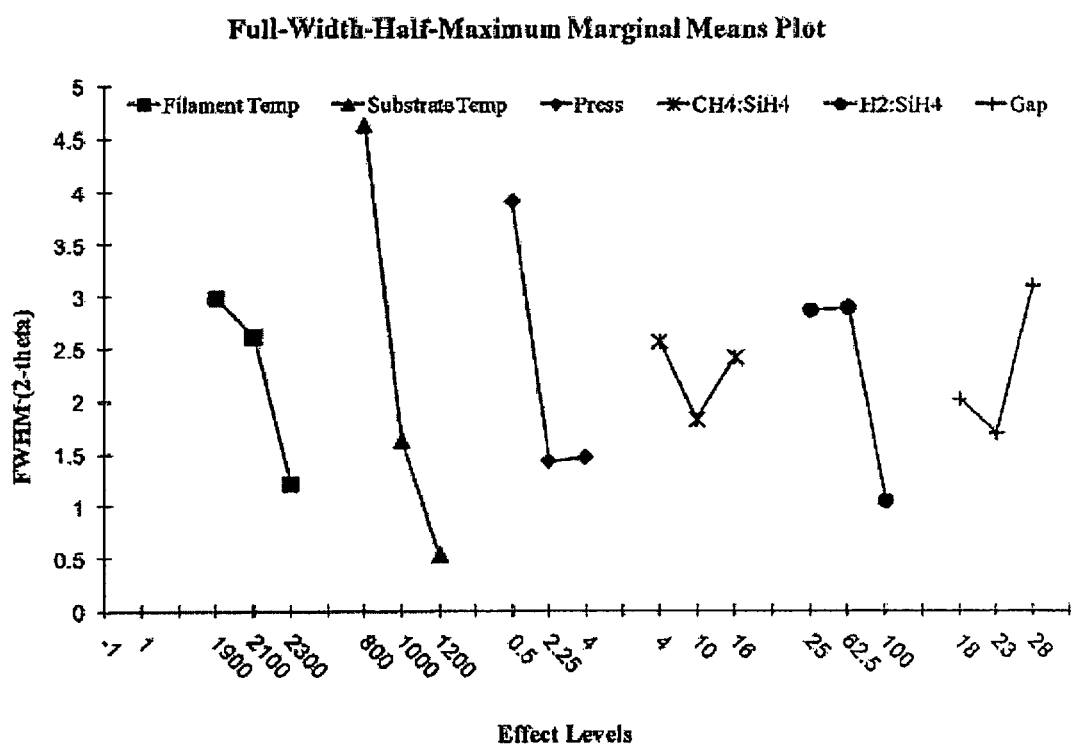
FIG. 9 shows a marginal means plot for the full-width-half-maximum (FWHM) of the XRD results from the DOE.

The values for the FWHM of each film are provided in FIG. 5, and the results of the regression model is given in FIG. 7. The P(2tail) in the regression model indicates that filament temperature, substrate temperature, pressure, and $H_2$:$SiH_4$ ratio can all be considered to have a significant effect on the crystallinity. The marginal means plot for each factor is given in FIG. 9. In this plot, lower values of the average FWHM indicate better crystallinity of the films. As one might expect, substrate temperature has the largest effect on the crystallinity. Another interesting result was that an increase in pressure from 0.5 to 2.25 Torr showed a substantial improvement in crystallinity, but was not significant for growth rate. It is also important to note that filament temperature was found to be significant in both the growth rate and crystallinity models, differentiating the HFCVD results from standard thermal CVD. This is beneficial in that the substrate temperature can be reduced in HFCVD system, while growth rate and crystal quality can still be maintained.

An optimized recipe was tested to verify the results of the DOE. The setpoints were chosen to first maximize crystallinity (minimize FWHM) by picking the most beneficial setpoints: filament temperature (2300° C.), substrate temperature (1250° C.), chamber pressure (4 Torr), $H_2$:$SiH_4$ ratio (100:1). Then the parameters which were not significant for crystallinity were chosen to maximize growth rate, $CH_4$:$SiH_4$ ratio (16:1) and the filament to substrate gap (18 mm). The results of this test show an increase in growth rate to 120 nm/min, while the XRD data show that the highly oriented <111> 3C crystal structure (FWHM, 2θ=0.30°) was maintained. These test conditions were used as a starting point for the experiments in Section A.2, where the characterization is presented in more detail.

A.2 Individual Parameters

Figure 11:
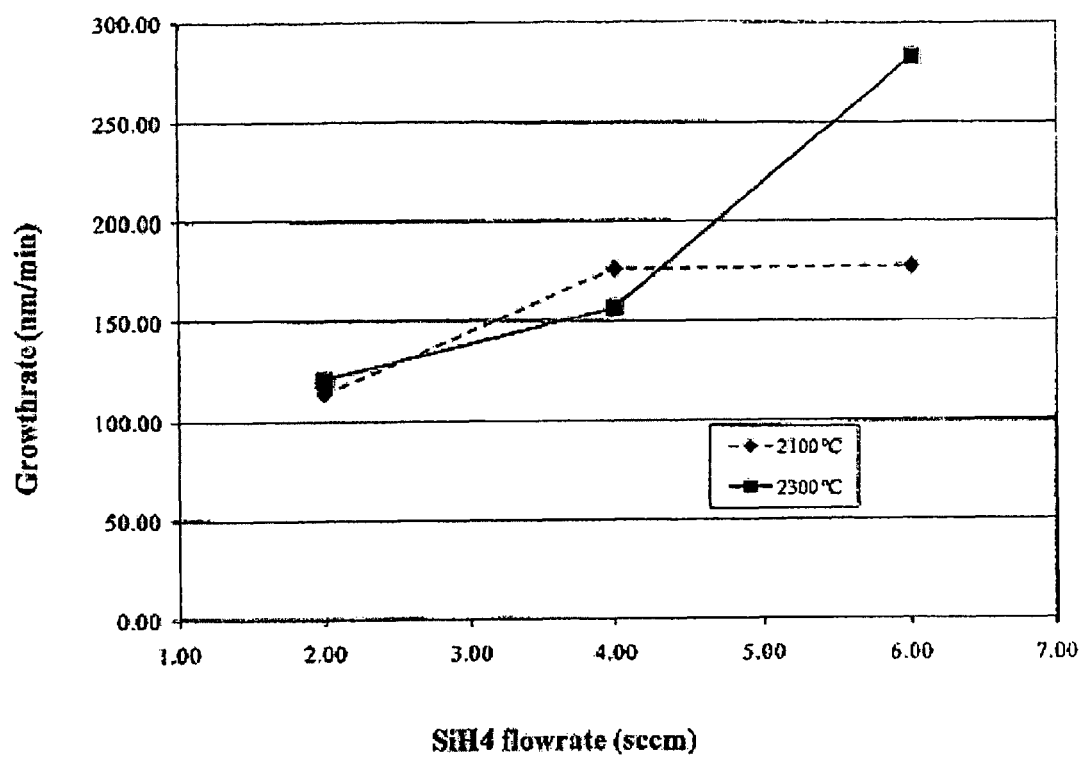
FIG. 11 shows a plot of growth rate versus silane ($SiH_4$) flowrate at filament temperatures of 2100° C. and 2300° C.

The DOE results were used as a starting point to look at 2 individual parameters, $SiH_4$ flowrate and filament temperature. The test conditions are given in FIG. 10. The growth rate results are provided in FIG. 11. At a filament temperature of 2100° C. the growth rate increased from 114 nm/min to 178 nm/min as $SiH_4$ was increased from 2 to 4 sccm, but additional increases of the $SiH_4$ flowrate did not show any improvement in growth rate. At a filament temperature of 2300° C. the growth rate was approximately the same for the $SiH_4$ flowrates of 2 and 4 sccm, but in this case the growth rate continued to increase to 283 nm/min as the flowrate was increased to 6 sccm.

Figure 12:
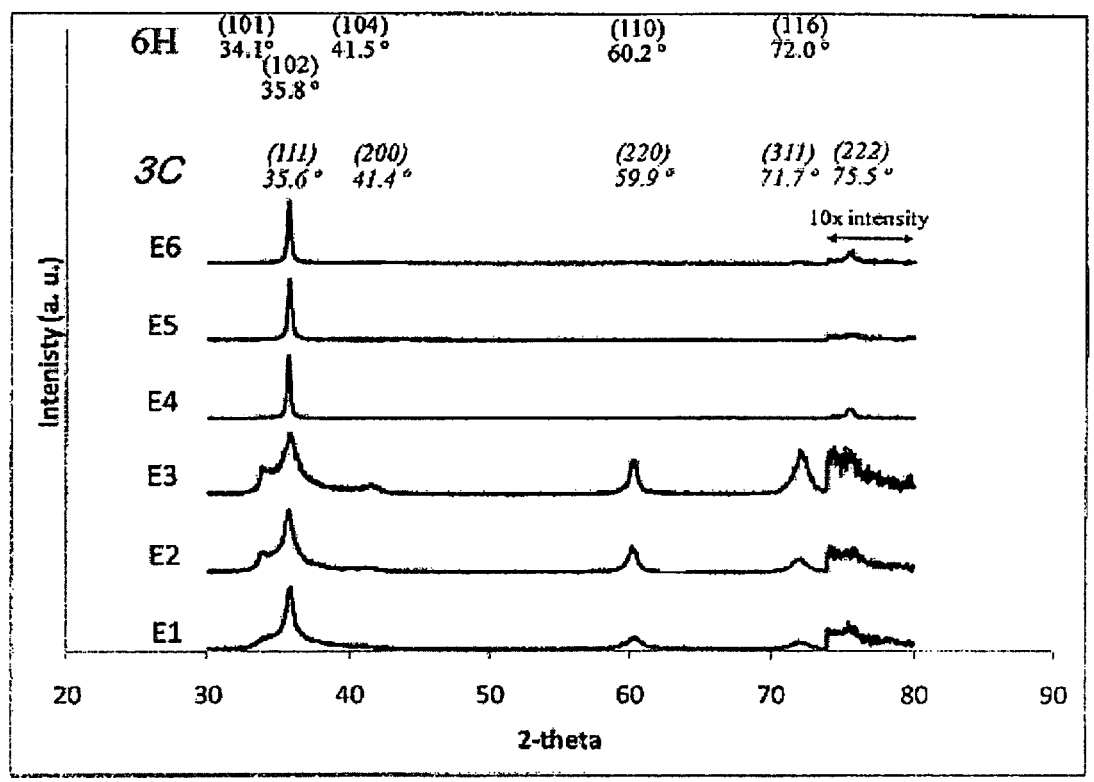
FIG. 12 shows a plot of XRD data for individual parameter experiments.

XRD data were collected on all the samples deposited in this test and are provided in FIG. 12. The intensity of the 2θ values from 70°-80° was increased by 10× so the 3C (222) peak could be easily observed in this figure. The three samples that were deposited with a filament temperature of 2300° C. displayed only the 3C polytype SiC oriented in the (111) direction. These were identified as 3C because the (222) peak had an intensity value of 3% of the (111) peak as quoted in the filed crystal literature, and no 6H peaks were present. The fact that only the (111) and (222) peaks were present indicates that films grew only (111) planes parallel to the substrate surface. For samples grown with a filament temperature of 2100° C., the XRD pattern indicates that the SiC layer contains both 3C and 6H polytypes. Although many of the peaks could be identified as either 3C or 6H, the peak at 2θ=34° was a clear indication of 6H polytype, as this will not occur for 3C. This was a very interesting result. In general it is known in the literature that the 3C is the stable polytype that grows at substrate temperatures <~1700° C. by CVD. The difference in the films may have been due to increased etching from hydrogen at the higher filament temperatures, which did not allow the 6H formation. Also, it should be noted, that the crystallinity was not affected by the ~2.5× increase in growth rate seen for samples grown at a filament temperature of 2300° C.

The XRD data of tests E4-E6 were analyzed further to get a better indication of crystal quality. Peak broadening can be caused by instrumental imperfections, layer strain, and crystallite grains. To estimate the instrumental broadening of the XRD system used, the diffraction peaks of pure silicon, commercial 6H SiC, and 4H SiC wafers were collected. The full-width-half-maximum of the major peaks for these samples were found to be 2θ=0.20° (@ 28.4° for (111) Si), 0.20 (@ 35.8° for 6H SiC), and 0.25 (@ 35.6° for 4H SiC). For these tests the 2θ was stepped by 0.05° intervals so the values had an error of ±0.05°. For samples E4-E6 in FIG. 10 the FWHM of the (111) peak was measured to be 0.30°. The thicknesses of these layers were only 2.4, 3.1, and 5.3 µm. There is a ~20% lattice mismatch between 3C SiC and Si, which means the film will be highly strained. With the large amount of strain in the layers the narrow FWHM indicates a high crystal quality, with large, well oriented grains.

A.3 Deposition on SiC Substrates

Figure 13:
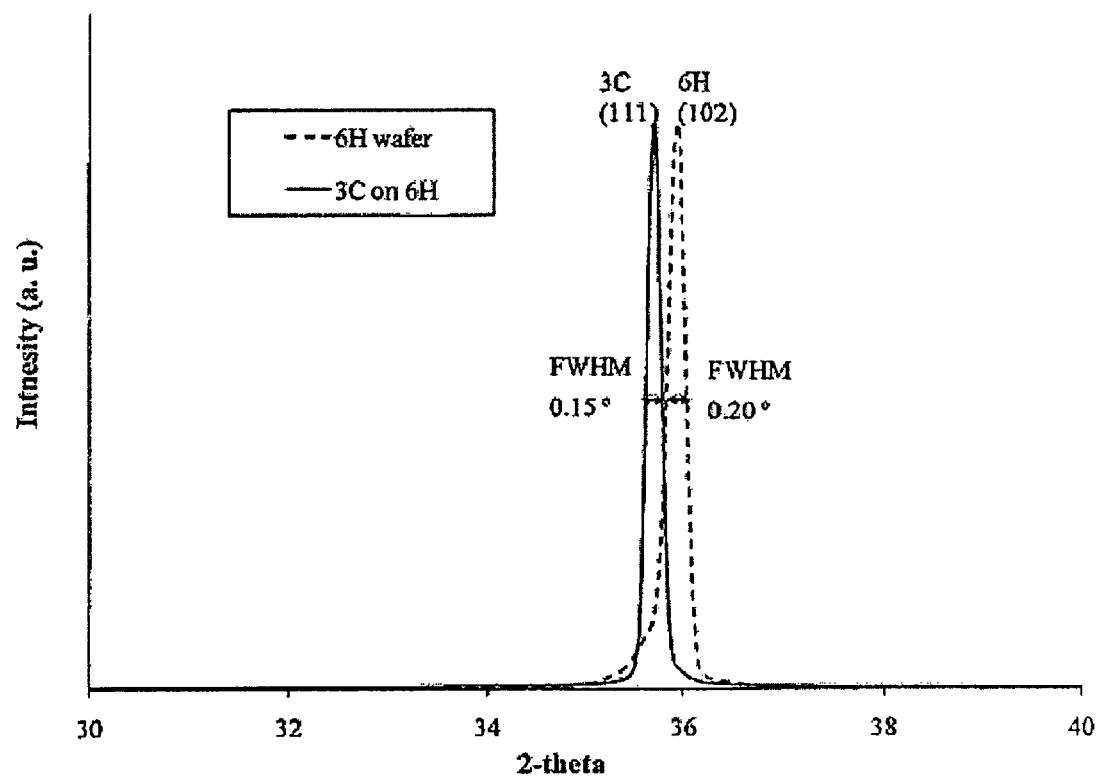
FIG. 13 shows a plot of XRD data for a commercial 6H substrate compared to the 3C SiC layer grown on the substrate.

Several samples were grown on 6H and 4H SiC commercial substrates. Recipes E4, E5, and E6 (see FIG. 10) were used for these tests. All growth rates on SiC substrates corresponded to those observed on Si substrates. Thick films (>25 µm) were deposited, so that background noise from the SiC substrate would not significantly contribute to the overall XRD signal. FIG. 13 compares the XRD pattern for a 35 µm thick film grown on a 6H SiC substrate to the pattern of the bare substrate. For the 3C film the FWHM was measured to be approximately the same as the substrate: 3C film=0.15°, commercial 6H substrate=0.20° (XRD data was taken at 0.05° steps). This indicates that the deposited films have comparable crystal quality to the commercial substrate. Recipe E6 (see FIG. 10) was used for the deposition of this sample, which yielded a growth rate of 285 nm/min.

Figure 14:
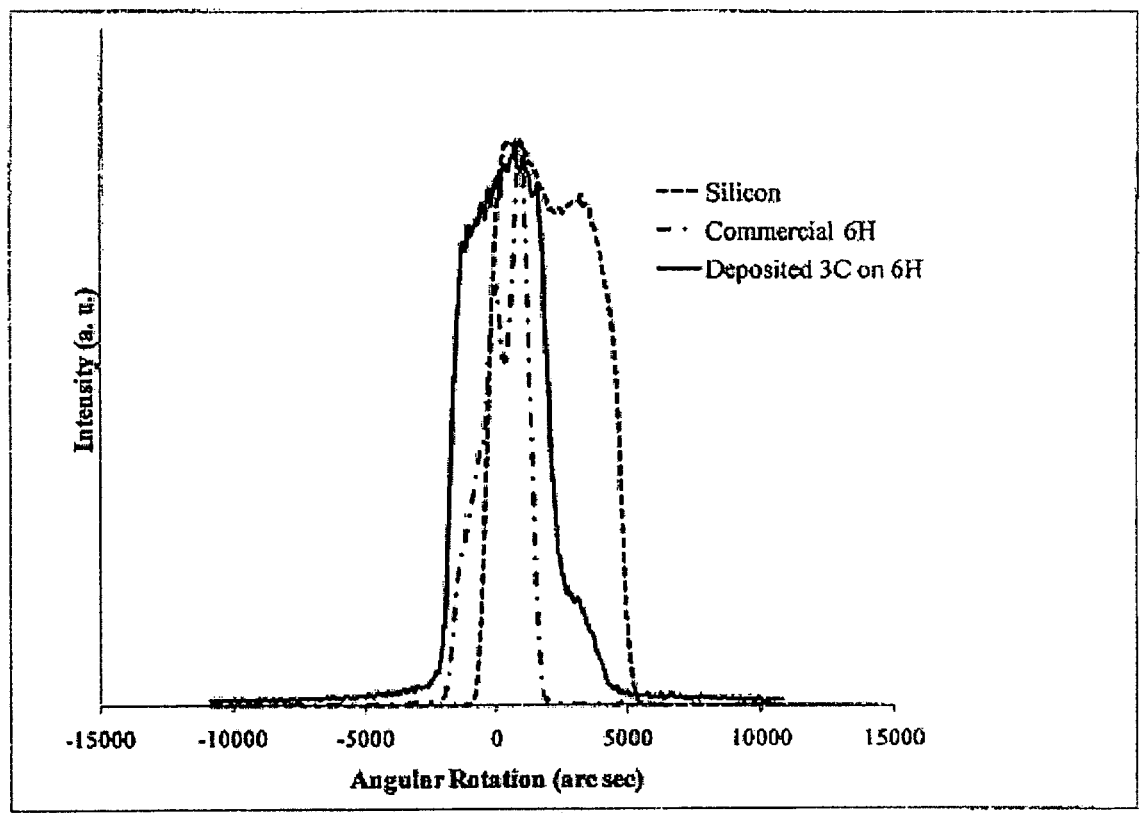
FIG. 14 shows a plot of rocking curves for a Si wafer, 6H wafer, and deposited 3C film.

Rocking curve analysis is a sensitive technique for determining degree of crystallinity in a sample. In this technique, the source and detector angle are fixed at the 2θ Bragg condition for a diffraction peak of interest, and the sample is rotated. The width of a rocking curve is a direct measure of the range of orientation and, to a lesser extent, the amount of strain present in the sample. Rocking curves are shown in FIG. 14 for a (111) Si wafer, a commercial 6H SiC wafer, and the 3C deposition on the 6H wafer. The Si rocking curve was collected as a reference sample to determine the intensity width due to the instrument, as the Si wafer was assumed to be nearly a perfect crystal. The width of the deposited 3C SiC layer rocking curve compared very well to that of the commercial Si and SiC. This test is very sensitive to misorientation, stress, and small grains within the material, so this result indicates that the film was single crystal or has very large grains that closely oriented in the (111) direction.

In some embodiments, the silicon carbide boule has a thickness of about 5 mm or more.

Additional System Embodiments

Figure 15:
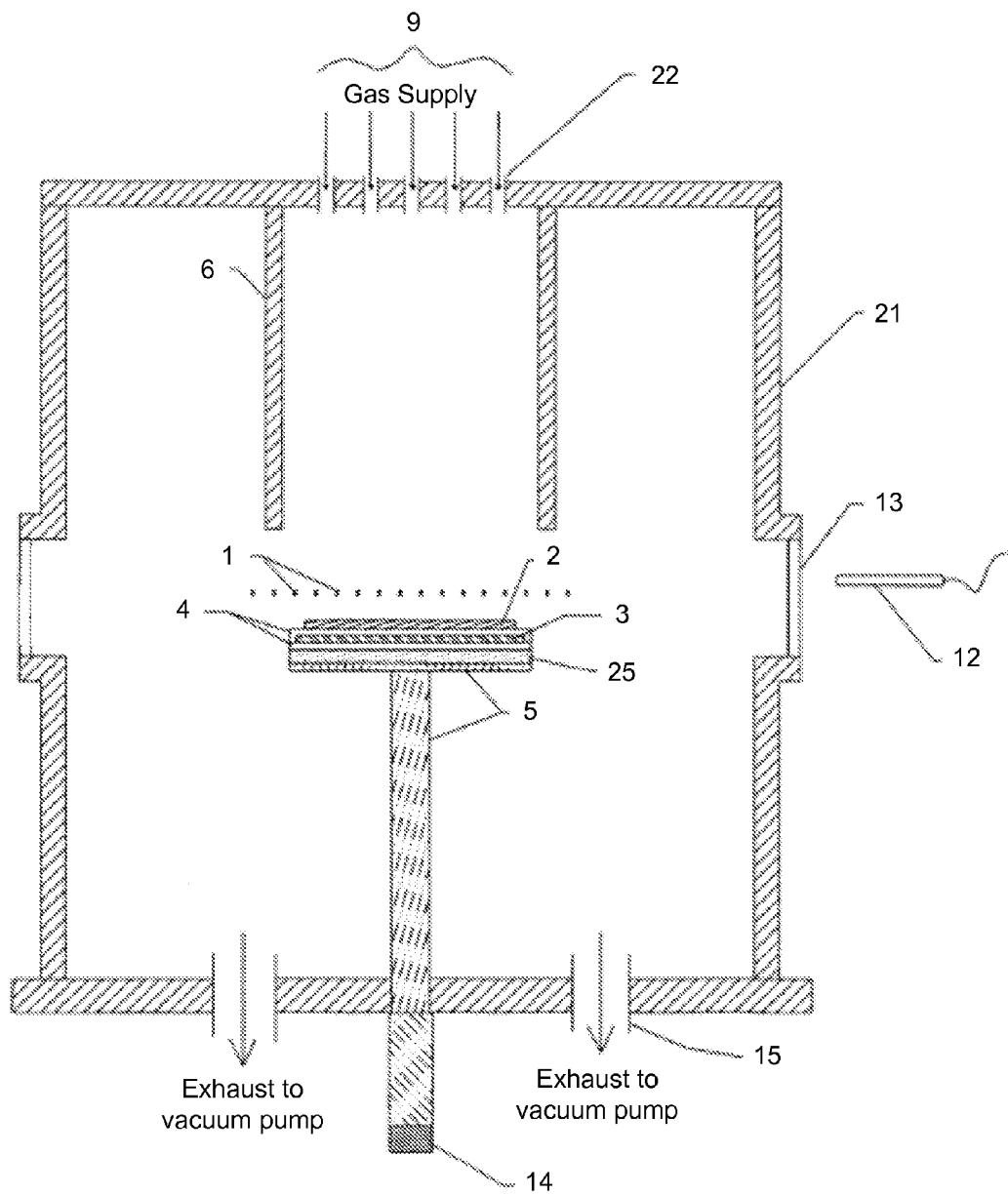
FIG. 15 shows a cut-away side-view of a deposition chamber used for growing SiC boules according to embodiments of this invention.

Another exemplary system according to embodiments of the invention is shown in FIG. 15. This system may be designed to further isolate the filament and deposition area from any influence due to the vacuum chamber walls 21, thus reducing particle incorporation and defects in the growing boule associated with material buildup on walls and components. The chamber shell 21 may be cooled using a double wall construction through which chilled water is continuously circulated. The reactant gases 9 may enter through a gas inlet manifold 22 which ensures a uniform flow profile through the water-cooled gas inlet tube 6. Additional deposition chambers may include the removal of the inlet gas cylinder 6, and the introduction of the precursors from the side or below the substrate. Flowrates of each precursor and carrier gas may be controlled using mass flow controllers. Unreacted precursors and byproducts may be exhausted from the chamber through ports 15 located at the bottom of the chamber. The chamber pressure may be controlled using an automatic butterfly valve located in the exhaust system prior to a vacuum pump.

The temperature of the filaments may be estimated using a calibrated pyrometer 12 located outside a quartz window 13. Additionally the temperature of the filaments can be continuously monitored and adjusted by putting the pyrometer output into a feedback loop that adjusts the output power of the power supply as needed to maintain the specified temperature.

SiC substrates 2 of a specified polytype are placed on a resistive heater 3 enclosed in a boron nitride shell 4 capable of maintaining temperatures of ~1700° C. The heater may be placed on an alumina plate 25 attached to a water-cooled steel assembly 5. The entire substrate assembly may be connected to a variable height linear motion feedthrough 14, which may be used to control filament to boule distance. This distance may be controlled manually or automatically. The view through the windows 13 may be used to monitor and maintain the desired filament to growth surface distance.

In the embodiment shown in FIG. 15, the outer shell 21 of the vacuum chamber is 75 cm in height by 60 cm in width. The substrate or seed crystal 2 is 200 mm in diameter. The filaments 1 are 1.5 mm in width, 4 mm in height, and 320 mm in length for each segment. Seventeen filaments 1 are electrically connected in series and evenly spaced 15 mm apart. The filament configuration is similar to the one shown in FIG. 2. In this example the areal extent may be larger than the growing boule surface, leading to uniform growth rate across the entire diameter. The inner diameter of the gas inlet tube 6 is 250 mm.

FIGS. 16A & B show a detailed view of the filaments assembly according to embodiments of the invention. The filaments 1 may consist of tantalum metal coated in tantalum carbide. The filaments may be connected in series to a dc power supply capable of producing currents that will be able to heat the ribbons to >2500° C. A water-cooled steel frame 23 may be used to mount a ceramic frame and ceramic blocks 7, which may be used to maintain uniform spacing, ensure electrical isolation, and reduce heating of the steel frame. The filaments may be held under slight tension to insure proper alignment of the filaments, and allow for expansion under heating. A tension means could be selected from springs pushing against the inner portion of the steel filament assembly frame 23, or any other means of exerting tension such as pulling the outer portion of the assembly. To minimize edge effects, the area of the ribbon array may be larger than the inlet gas tube 6 diameter. Round filaments or wire may also be used in addition to (or in lieu of) ribbon shaped filaments. Examples of filament shapes may also include flat filaments. In this example the filaments are evenly spaced and arranged on the assembly in a rectangular pattern. The filaments may also have irregular spacing and be arranged in other patterns such as circular or hexagonal.

A curtain gas may be used to reduce or eliminate material build up on the filament assembly, which can cause shorting between the filaments and lead to particle formation. FIGS. 16A & B depict one example where a gas is introduced though a gas inlet tube 24 located in close proximity above the edge of the filament assembly. The gas can be an inert such as argon or helium, or a diluting gas such as hydrogen.

Filament Materials

The filaments may be selected to maintain a constant temperature for several weeks to produce quality SiC boules of significant length. Filament materials may also be selected to minimize contamination of the SiC substrate. Embodiments of filaments may include refractory metal filaments (e.g., tungsten, molybdenum, niobium, tantalum, rhenium, etc.). The filaments may be treated with hydrocarbons (e.g., $C_2H_2$, $CH_4$, etc.) to form a metal carbide (e.g., TaC) surfaces. Carbonization of the filament will occur at practical filament temperatures (e.g., less than 2000° C.) when exposed to a variety of hydrocarbons.

In the case of tantalum carbide, TaC is used for several high temperature applications, such as gas turbine engines, where toughness and chemical stability at high temperatures are required. Stoichiometric TaC is stable up to 4000° C. and has an extremely low vapor pressure at temperatures less than 2500° C., thus minimizing the contaminates produced in the SiC boule. It is also extremely stable and not prone to etching from hydrogen or silicon species and does not form silicides.

By introducing hydrocarbons such as $CH_4$ over hot refractory metal filaments, a graphite layer will grow and begin to form TaC on the filament surface. The carbon may diffuse into tantalum forming stoichiometric TaC at the surface. This creates a barrier layer, which reduces sublimation and etching of the Ta metal filament. Thus the temperature of the pretreated filament surface can be held constant for more than a week by controlling the applied current.

The filament material and structure of the filaments may be selected to produce commercially useful SiC boules. The filaments may be selected to reduce or avoid degradation of filament material during a SiC growth process caused by, for example: a) the degradation and/or the formation of deposits from the precursors which shorten their lifetimes and reduce system productivity; and b) the introduction of impurities to the boule from particles flaking off the filaments which can reduce the usable area of wafers sliced from the boule.

The filaments may also be designed with respect to shape, size and free space gaps to expose precursors to precise, low variation (e.g., variation approaching zero) thermal breakdown temperatures. Precision in the deployment of the filaments structure allows for optimization of heat and flow rate as relevant to the particular polytype boule being grown.

Precursor Materials

There are a variety of precursor choices for the deposition SiC by HFCVD including: silane ($SiH_4$), methlysilanes, and halogenated precursors. Examples of HFCVD depositions of amorphous and crystalline SiC may include the use of $SiH_4$ and basic hydrocarbon precursors ($CH_4$, $C_2H_2$, $C_2H_6$ and $C_3H_8$), and may further include the dilution of these precursors with hydrogen gas ($H_2$). For example $SiH_4$, $CH_4$ and/or $C_2H_6$, and $H_2$ may be used for the deposition. Under some conditions, $C_2H_6$ may decompose more readily than $CH_4$, to give better control of C:Si ratio at lower filament temperatures.

Hydrogen gas ($H_2$) dilution may be used in some examples to help prevent build-up of carbon and silicon on filament surfaces via etching by atomic hydrogen. Also, hydrogen radicals can remove excess, non-reactive carbon and silicon at the substrate. Hydrogen radicals may preferentially etch Si—Si structures compared to Si—C bonds at the surface allowing for the formation of stoichiometric SiC without incorporating hydrogen at elevated substrate temperatures.

Additional precursors may also include alkylsilanes. The alkylsilane precursor $CH_3SiH_3$ includes a Si:C ratio of 1 and can decrease the Si—Si and C—C clusters while the Si—C bond in the precursor is preserved. Alkylsilanes are also generally safer to handle than $SiH_4$. The growth conditions such as filament and substrate temperature may be adjusted to deposit stoichiometric SiC.

Halogenated precursors may also be used in the SiC depositions. For example, $SiCl_4$ has been used to grow SiC with thermal CVD. However, the Cl concentration during the deposition should be controlled to avoid excessive etching of the SiC, which can result in a reduced growth rate. Some embodiments mix halogenated precursors with $H_2$ to scavenge excess Cl, and increase the SiC growth rate. For example, deposition rates of ~0.5 μm/min have been achieved using $CH_3SiCl_3$ in $H_2$ dilution. In addition, the HCl can etch Si at a higher rate than SiC. This difference in etch rates may be helpful for creating single crystal SiC by reducing high Si concentrations at the surface which can cause defects.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention. Any dimensions provided are for illustrative purposes only and are not intended to be limiting.

As used herein and in the appended claims, the singular forms "a", "an", and "the" include plural referents unless the context clearly dictates otherwise. Thus, for example, reference to "a process" may includes a plurality of such processes and reference to "the layer" may include reference to one or more layers and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, or groups.

What is claimed is:

1. A method to grow a boule of silicon carbide, the method comprising:
    providing a vapor deposition chamber comprising a plurality of filaments, a substrate pedestal, and a substrate that is in operable communication with the substrate pedestal, wherein the distance between the substrate surface and the plurality of filaments ranges from 18 to 25 mm, and wherein the position of the substrate pedestal relative to the plurality of filaments is adjustable;
    heating the plurality of filaments to at least 2300° C.;
    flowing a silicon-containing precursor and a carbon-containing precursor proximate to the plurality of heated filaments, thereby depositing silicon carbide on the substrate by chemical vapor deposition to form a silicon carbide boule having a thickness of at least 5 mm;
    during the deposition, moving the position of the substrate pedestal relative to the plurality of filaments so as to maintain a distance of 18 to 25 mm between the plurality of heated filaments and the surface of the boule.

2. The method of claim 1, wherein the depositing is carried out in a continuous process for a period of one week or more.

3. The method of claim 1, wherein the silicon containing precursor and the carbon containing precursor are different precursors.

4. The method of claim 1, wherein the silicon-containing precursor comprises silane ($SiH_4$).

5. The method of claim 1, wherein the carbon-containing precursor comprises methane ($CH_4$) or ethane ($C_2H_6$).

6. The method of claim 1, wherein the method further comprises flowing hydrogen gas proximate to the plurality of heated filaments.

7. The method of claim 1, wherein the method further comprises flowing a precursor containing both carbon and silicon proximate to the plurality of heated filaments.

8. The method of claim 1, wherein the method further comprises flowing an inert gas proximate to the heated filament plurality of heated filaments.

9. The method of claim 8, wherein the inert gas comprises helium, neon, or argon.

10. The method of claim 1, wherein each of the plurality of filaments comprises a refractory metal.

11. The method of claim 10, wherein the refractory metal comprises tantalum.

12. The method of claim 10, wherein each of the plurality of filaments comprises a carbon containing outer surface.

13. The method of claim 10, wherein the plurality of filaments are connected electrically in series or in parallel.

14. The method of claim 12, wherein the carbon containing outer surface is tantalum carbide (TaC).

15. The method of claim 1, wherein a growth rate for the silicon carbide boule is greater than 60 µm/hr.

16. The method of claim 1, wherein the silicon carbide boule comprises single-crystalline silicon carbide.

17. The method of claim 16, wherein the single-crystalline silicon carbide comprises cubic 3C—SiC.

18. The method of claim 16, wherein the single-crystalline silicon carbide comprises hexagonal 4H or 6H SiC.

19. The method of claim 1, wherein the substrate is a silicon substrate.

20. The method of claim 1, wherein the substrate is a silicon carbide substrate.

21. The method of claim 1, wherein the silicon carbide boule has a cylindrical shape with a diameter of 3 inches or more.

22. The method of claim 1, wherein the silicon carbide boule has a cylindrical shape with a long axis of 2 inches or more.

23. The method of claim 1, wherein the crystalline silicon carbide has a shape selected from the group of shapes consisting of circular, elliptical, and polygonal.

24. The method of claim 1, wherein the method further comprises flowing a dopant precursor proximate to the plurality of heated filaments, wherein the dopant precursor forms an n-type or p-type carrier in the silicon carbide boule.

25. The method of claim 24, wherein the dopant precursor comprises nitrogen.

26. The method of claim 24, wherein the dopant precursor comprises aluminum.

27. A method to deposit a crystalline silicon carbide boule on a substrate, the method comprising:
    providing a vapor deposition chamber comprising a plurality of filaments, a substrate pedestal, and a substrate that is in operable communication with the substrate pedestal, wherein the distance between the substrate surface and the plurality of filaments ranges from 18 to 25 mm, and wherein the position of the substrate pedestal relative to the plurality of filaments is adjustable;
    heating the plurality of filaments to at least 2300° C.;
    depositing the crystalline silicon carbide on the substrate surface by flowing a silicon-containing precursor and a carbon-containing precursor proximate to the plurality of heated filaments thereby thermally activating gaseous deposition precursors and reacting the activated precursors at the substrate surface to form a silicon carbide boule having a thickness of at least 5 mm;
    during the deposition, moving the position of the substrate pedestal relative to the plurality of filaments so as to maintain a distance of 18 to 25 mm between the plurality of heated filaments and the surface of the boule.

28. The method of claim 27, wherein the deposition precursors comprise silane and ethane.

29. The method of claim 27, wherein the depositing comprises flowing hydrogen ($H_2$) proximate to the plurality of heated filaments.

30. The method of claim 27, wherein each of the plurality of heated filaments is a tantalum filament that has an outer surface of tantalum carbide.

31. The method of claim 27, wherein the crystalline silicon carbide comprises cubic 3C—SiC.

32. The method of claim 27, wherein the crystalline silicon carbide comprises 6H or 4H SiC.

33. The method of claim 27, wherein the crystalline silicon carbide has a cylindrical shape with a diameter of 3 inches or more.

34. The method of claim 27, wherein the crystalline silicon carbide has a cylindrical shape with a long axis of 6 inches or more.

35. The method of claim 27, wherein the crystalline silicon carbide has a shape selected from the group of shapes consisting of circular, elliptical, and polygonal.

36. The method of claim 1, wherein the silicon carbide boule has a diameter of 2 inches or more.

37. The method of claim 1, further comprising heating the substrate to at least 1250° C.

38. The method of claim 27, further comprising heating the substrate to at least 1250° C.

* * * * *